(12) United States Patent
Matsuzawa

(10) Patent No.: US 7,199,428 B2
(45) Date of Patent: Apr. 3, 2007

(54) MASTER CHIP, SEMICONDUCTOR MEMORY, AND METHOD FOR MANUFACTURING SEMICONDUCTOR MEMORY

(75) Inventor: Kazuya Matsuzawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 11/098,671

(22) Filed: Apr. 5, 2005

(65) Prior Publication Data
US 2005/0226075 A1 Oct. 13, 2005

(30) Foreign Application Priority Data
Apr. 9, 2004 (JP) ............ P2004-115405

(51) Int. Cl.
*H01L 29/94* (2006.01)
(52) U.S. Cl. .............. 257/365; 257/366; 257/379; 257/903; 257/E27.098
(58) Field of Classification Search ................ 257/365
See application file for complete search history.

(56) References Cited

U.S. PATENT DOCUMENTS 5,825,684 A * 10/1998 Lee .............. 365/154

6,781,869 B2 8/2004 Ohbayashi et al.

FOREIGN PATENT DOCUMENTS

| JP | 6-291283 | 10/1994 |
| JP | 2003-297954 | 10/2003 |

OTHER PUBLICATIONS

Notice of Rejection issued by the Korean Patent Office on Sep. 26, 2006, for Korean Patent Application No. 10-2005-0029487, and English-language translation thereof.

* cited by examiner

*Primary Examiner*—Tu-Tu Ho
(74) *Attorney, Agent, or Firm*—Finnegan, Henderson, Farabow, Garrett & Dunner, L.L.P.

(57) ABSTRACT

A semiconductor memory includes first to sixth ridges, an insulating layers on the first to sixth ridges, a first gate line above the first to fourth ridges, and a second gate line above the third to sixth ridges, wherein the first and sixth ridges, the insulating layers, and the first and second gate lines implement first and second capacitors, the second and third ridges and the first gate line implement first driver and load transistors, and the fourth and fifth ridges and the second gate lines implement second load and driver transistors.

13 Claims, 35 Drawing Sheets

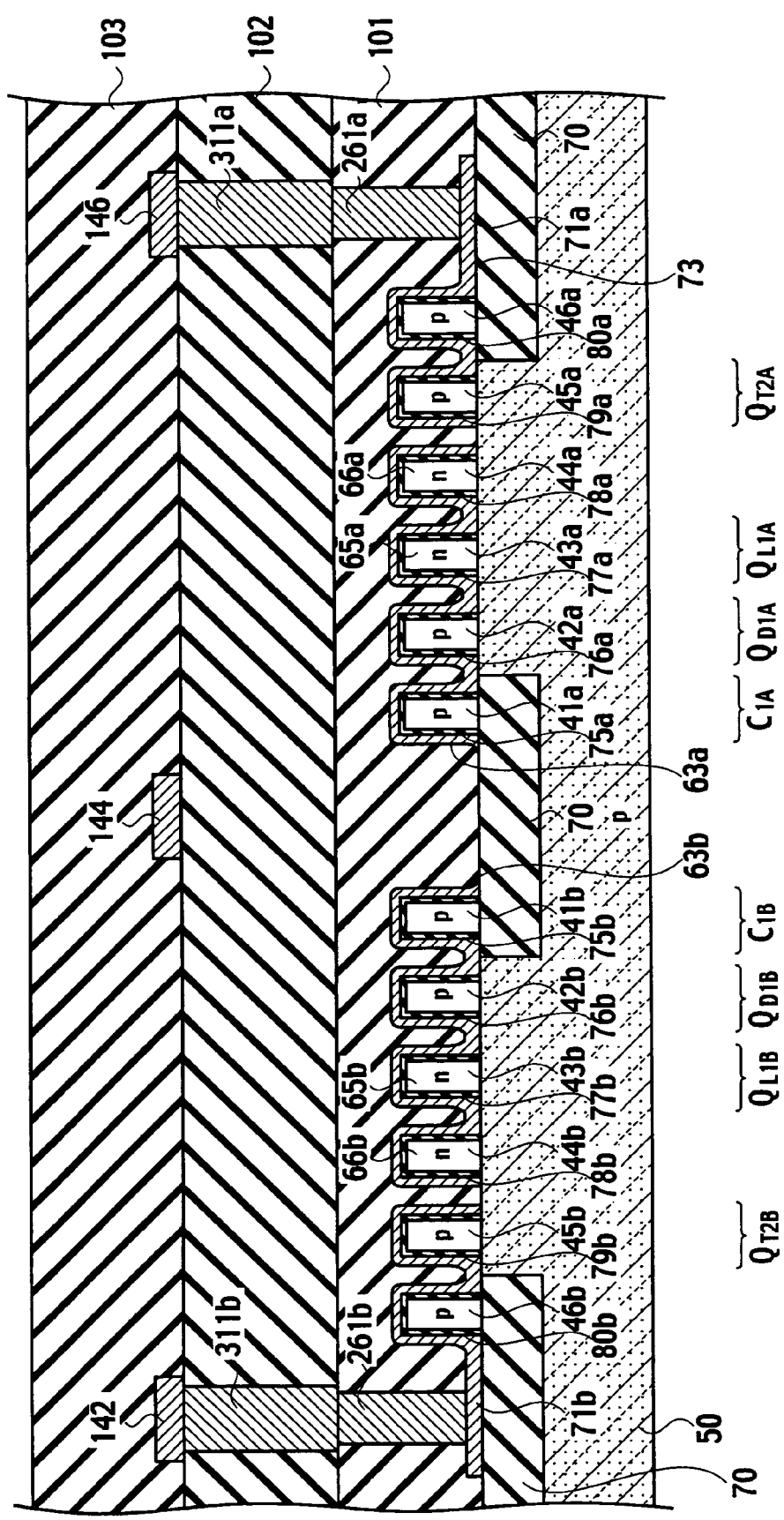

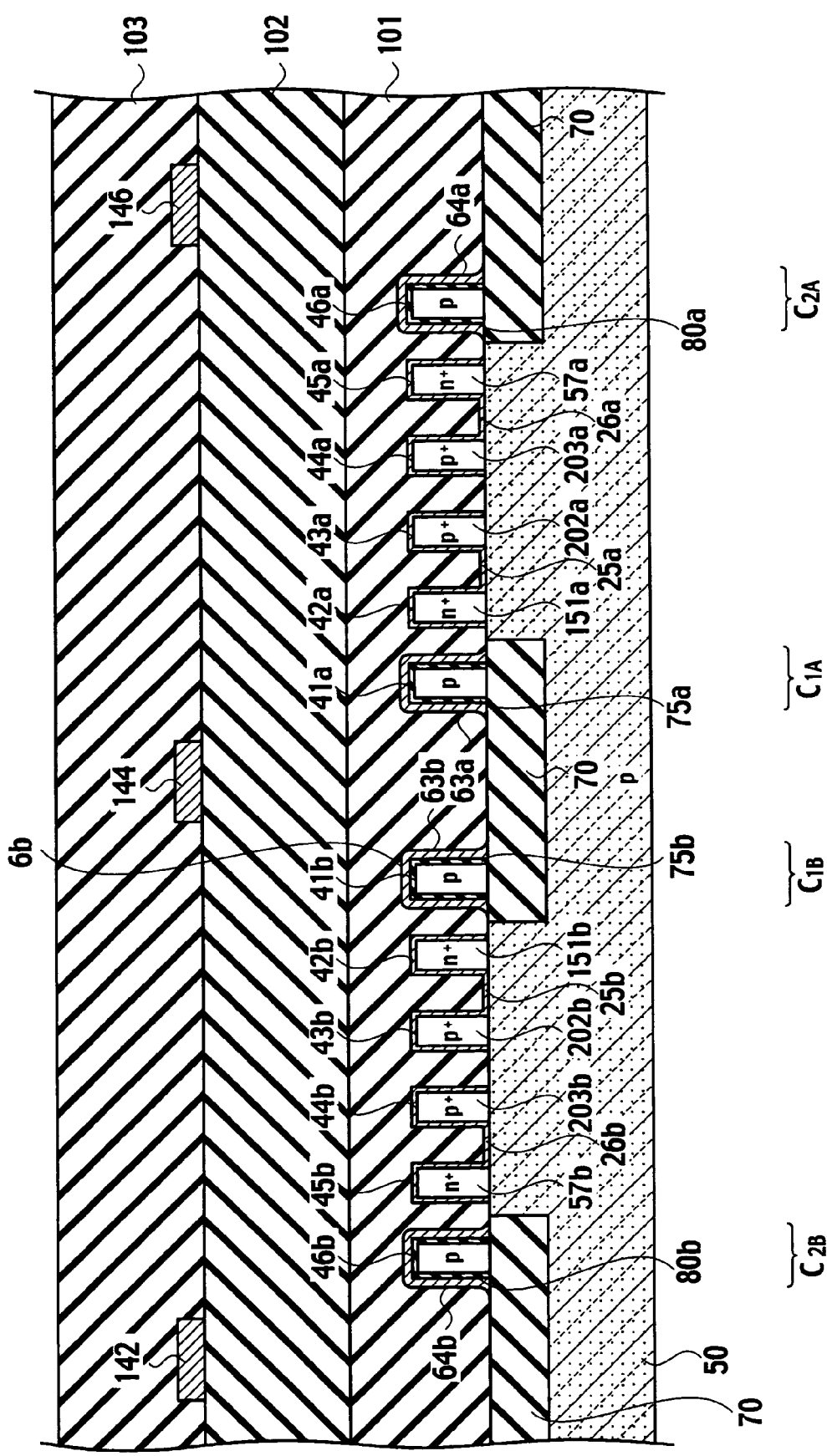

MASTER CHIP, SEMICONDUCTOR
MEMORY, AND METHOD FOR
MANUFACTURING SEMICONDUCTOR
MEMORY

CROSS REFERENCE TO RELATED
APPLICATIONS AND INCORPORATION BY
REFERENCE

This application is based upon and claims the benefit of priority from prior Japanese Patent Application P2004-115405 filed on Apr. 9, 2004; the entire contents of which are incorporated by reference herein.

BACKGROUND OF THE INVENTION

1. Field of the Invention

The present invention relates to a master chip, a semiconductor memory, and a method for manufacturing a semiconductor memory and in particular to a static RAM (SRAM).

2. Description of the Related Art

Generally, SRAM cell includes bistable flip-flop and two transfer transistors. The bistable flip-flop includes a pair of CMOS inverters and stores a logic state. If an energetic particle from environment, such as an alpha particle contained in cosmic rays or emitted from a radioactive atomic contained in materials for LSI package, strikes a depletion region between a channel and a diffusion region in a transistor of the CMOS inverter, electrons and holes may be generated in the depletion region. The generated electrons may be collected in the diffusion region along the boundary of the depletion region. If charge perturbation caused by the collected electrons is sufficiently large, the stored logic state may be reversed. Such phenomenon is commonly referred to as a "soft error". The soft errors are increased by miniaturization and lowered operating voltages of the SRAM cell. Here, Japanese Patent Laid-Open Publication No. 2003-297954 describes a method for adding a capacitor to a storage node of the SRAM cell to prevent the soft errors. However, the capacitor added to the storage node of the SRAM cell has occupied an additional space. Also, additional masks have been required to manufacture the added capacitor in lithography process. Consequently, complexity in a manufacturing process of the SRAM cell has been increased. Recently, vertical transistor has received much attention since large gate of the vertical transistor increases channel current and enhances device speed. Such vertical transistor also contains the soft error problem.

SUMMARY OF THE INVENTION

It is therefore an object of the present invention to provide a semiconductor memory providing improved immunity to the soft error without occupying additional space, increasing complexity in a manufacturing process, and additional masks required in a lithography process.

An aspect of present invention inheres in a master chip according to an embodiment of the present invention. The master chip includes a plurality of unit cells arranged in rows and columns Each of the unit cells includes a plurality of parallel semiconductor ridges including first to sixth ridges, an insulating layer disposed on each of the first to sixth ridges, a first gate line extending in a direction orthogonal to the first to sixth ridges and disposed above the first to fourth ridges, and a second gate line extending in the direction orthogonal to the first to sixth ridges and disposed above the third to sixth ridges, wherein the first ridge, the insulating layer, and the first gate line implement a first capacitor, the second and third ridges and the first gate line implement a first driver transistor and a first load transistor, the fourth and fifth ridges and the second gate lines implement a second load transistor and a second driver transistor, and the sixth ridge, the insulating layer, and the second gate line implement a second capacitor.

Another aspect of the present invention inheres in the semiconductor memory according to the embodiment of the present invention. The semiconductor memory includes a plurality of semiconductor ridges including parallel first to sixth ridges, an insulating layer disposed on each of the first to sixth ridges, a first gate line extending in a direction orthogonal to the first to sixth ridges and disposed above the first to fourth ridges, and a second gate line extending in the direction orthogonal to the first to sixth ridges and disposed above the third to sixth ridges, wherein the first ridge, the insulating layer, and the first gate line implement a first capacitor, the second and third ridges and the first gate line implement a first driver transistor and a first load transistor, the fourth and fifth ridges and the second gate lines implement a second load transistor and a second driver transistor, and the sixth ridge, the insulating layer, and the second gate line implement a second capacitor.

Yet another aspect of the present invention inheres in a method for manufacturing the semiconductor memory according to the embodiment of the present invention. The method for manufacturing the semiconductor memory includes forming parallel first to sixth ridges by selectively removing a semiconductor layer, doping first dopants into the third and fourth ridges selectively, depositing an insulating layer on each of the first to sixth ridges, depositing a polycrystalline silicon layer on the insulating layer, forming a first gate line extending in a direction orthogonal to the first to fourth ridges above the first to fourth ridges by selectively removing the polycrystalline silicon layer, forming a second gate line extending in the direction orthogonal to the third to sixth ridges above the third to sixth ridges by selectively removing the polycrystalline silicon layer, and doping second dopants and the first dopants into the second to fifth ridges to form a plurality of source and drain regions self aligned by the first and second gate lines.

BRIEF DESCRIPTION OF DRAWINGS

FIG. 34 is a first sectional view of the cell array in accordance with other embodiment of the present invention; and FIG. 35 is a second sectional view of the cell array in accordance with other embodiment of the present invention.

Figure 1:
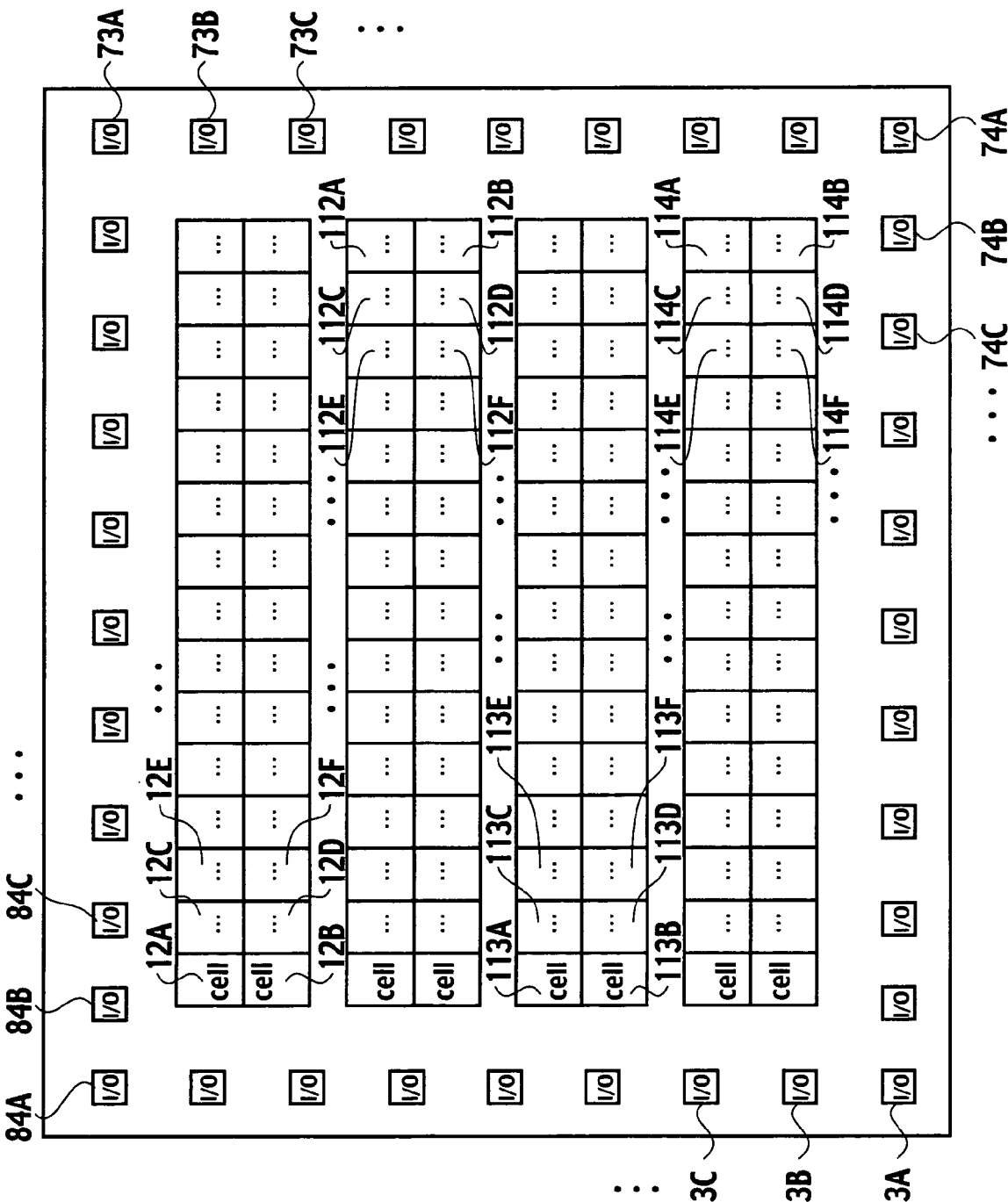
FIG. 1 illustrates a master chip composing a semiconductor integrated circuit in accordance with an embodiment of the present invention.

DETAILED DESCRIPTION OF THE INVENTION various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In a master chip according to an embodiment shown in FIG. 1, unit cells 12A, 12B, 12C, 12D, 12E, 12F, ..., 112A, 112B, 112C, 112D, 112E, 112F, ..., 113A, 113B, 113C, 113D, 113E, 113F, ..., 114A, 114B, 114C, 114D, 114E, 114F, and so forth are respectively arranged to compose a gate array. At a peripheral part of the master chip, I/O cells 73A, 73B, 73C, ..., 74A, 74B, 74C, ..., 83A, 83B, 83C, ... 84A, 84B, 84C, and so forth are respectively arranged, and the I/O cells can compose input buffers, output buffers, bidirectional buffers, and the like depending on respective terminals, by use of wiring masks.

Figure 2:
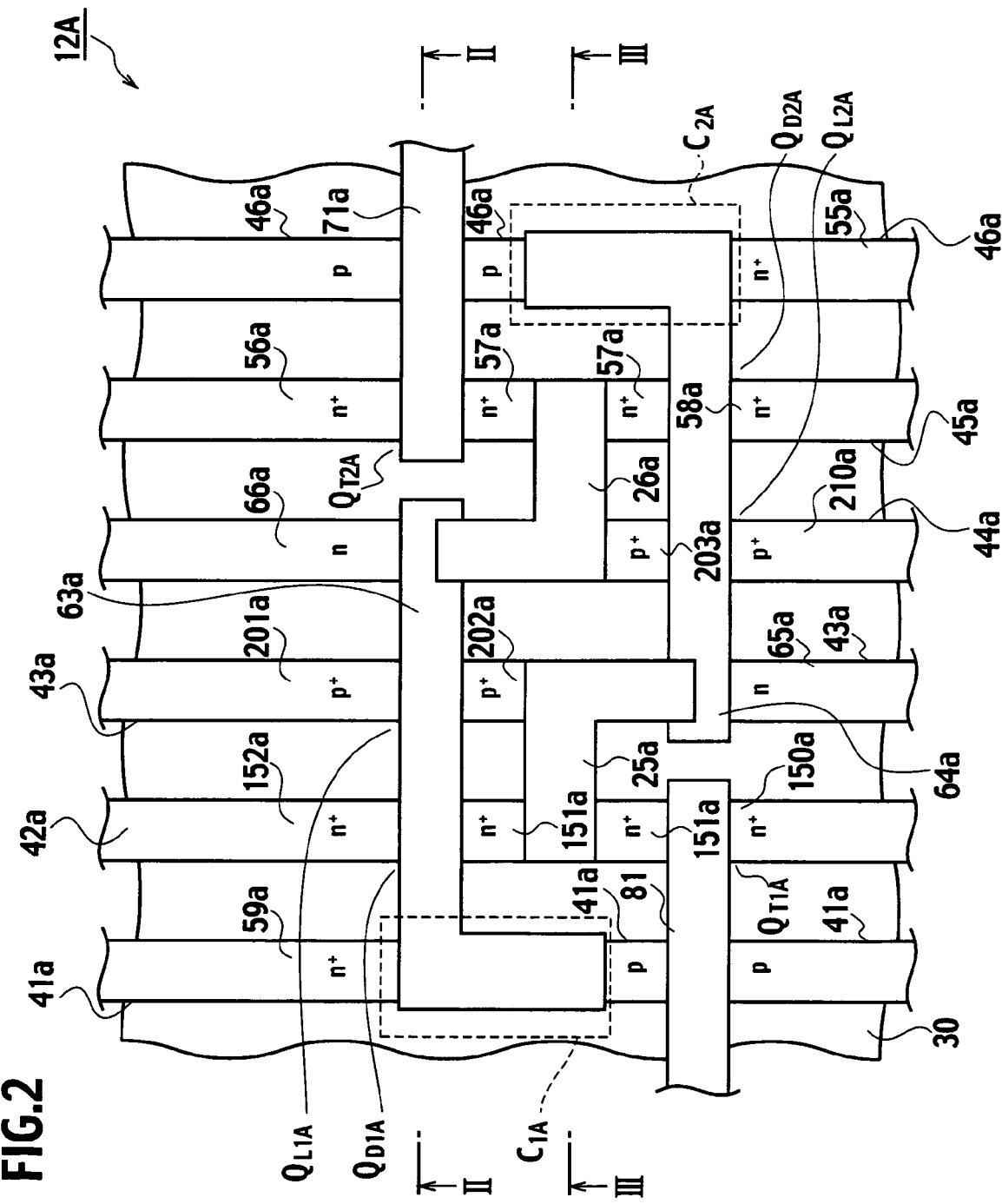
FIG. 2 is a top view of a unit cell in accordance with the embodiment of the present invention.
Figure 3A:
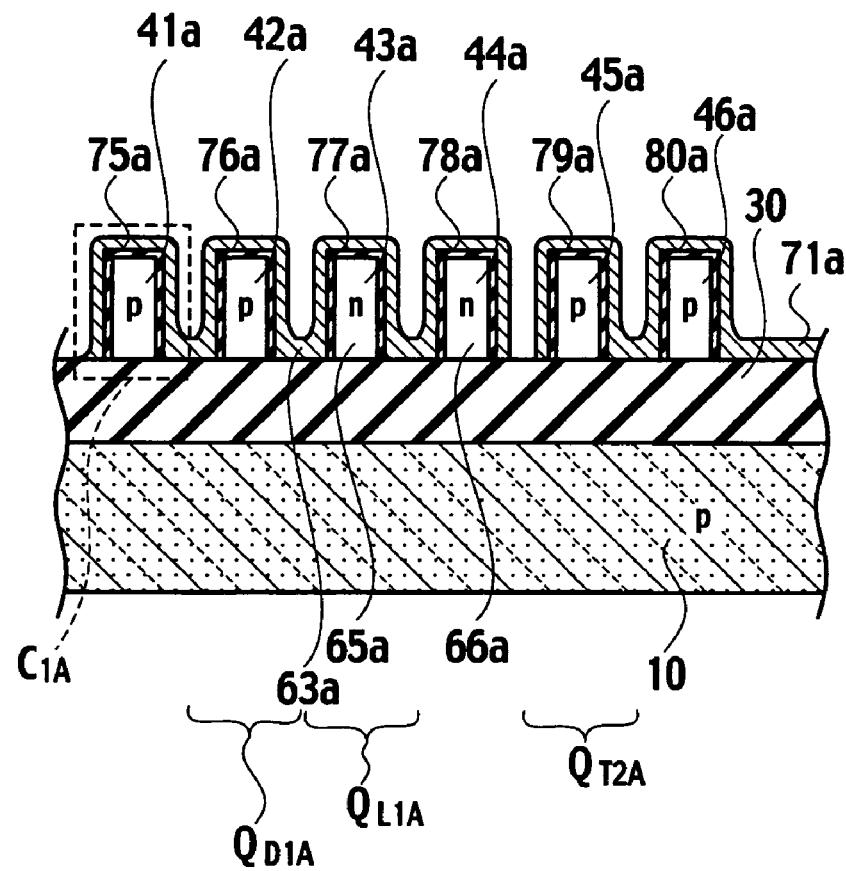
FIG. 3A is a cross sectional view of the unit cell shown in FIG. 2 cut from a direction of II—II line in accordance with the embodiment of the present invention.
Figure 3B:
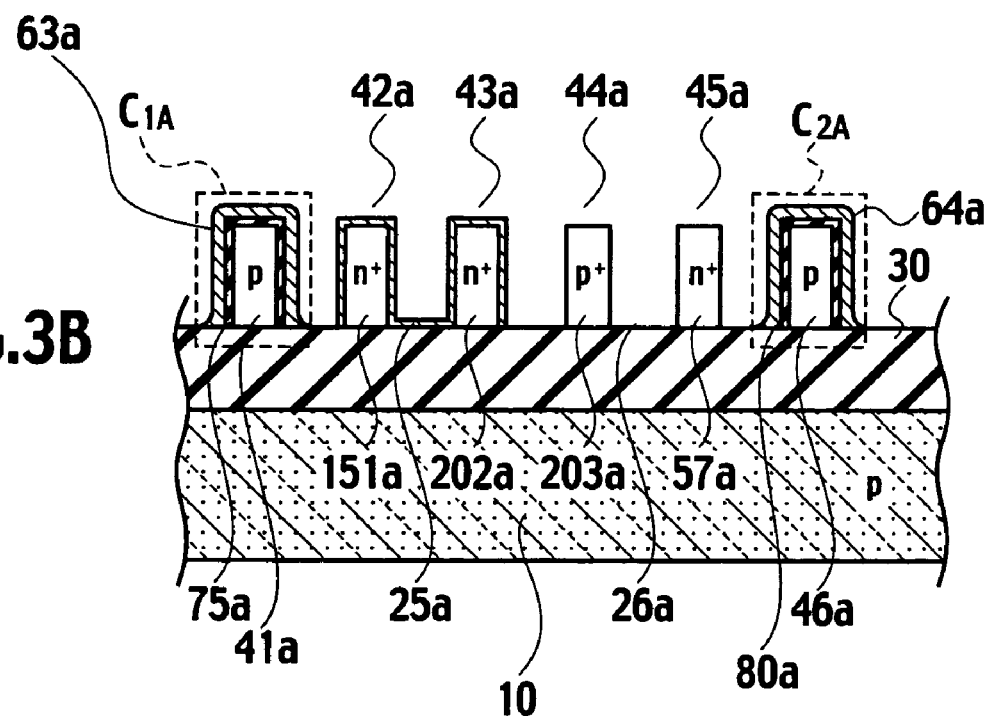
FIG. 3B is a cross sectional view of the unit cell shown in FIG. 2 cut from a direction of a III—III line in accordance with the embodiment of the present invention.

Moreover, as shown in FIG. 2, FIG. 3A which is a sectional view taken on line II—II in FIG. 2, and FIG. 3B which is a sectional view taken on line III—III in FIG. 2, the unit cell 12A includes a semiconductor substrate 10, a buried insulator 30 disposed on the semiconductor substrate 10, a first ridge 41a, a second ridge 42a, a third ridge 43a, a fourth ridge 44a, a fifth ridge 45a, and a sixth ridge 46a which are disposed on the buried insulator 30 and extend mutually parallel. Each of the first to sixth ridges 41a–46a is made of semiconductor. Also, the unit cell 12A includes insulating layers 75a, 76a, 77a, 78a, 79a, and 80a respectively disposed on the first to sixth ridges 41a to 46a, a first gate line 63a extending in a direction orthogonal to the first to sixth ridges 41a to 46a and disposed above the first to fourth ridges 41a to 44a, and a second gate line 64a extending in the direction orthogonal to the first to sixth ridges 41a to 46a and disposed above the third to sixth ridges 43a to 46a. Here, the "ridge" means a fin or a plate semiconductor region.

In the unit cell 12A, the first ridge 41a, the insulating layer 75a, and the first gate line 63a collectively implement a first capacitor $C_{1A}$. Similarly, the sixth ridge 46a, the insulating layer 80a, and the second gate line 64a collectively implement a second capacitor $C_{2A}$. Moreover, the second and third ridges 42a and 43a, the insulating layers 76a and 77a, and the first gate line 63a implement a first driver transistor $Q_{D1A}$ and a first load transistor $Q_{L1A}$. Further, the fourth and fifth ridges 44a and 45a, the insulating layers 78a and 79a, and the second gate line 64a implement a second load transistor $Q_{L2A}$ and a second driver transistor $Q_{D2A}$.

Isolated doped regions are provided in the second ridge 42a. The isolated doped regions have opposite conductivity to the conductivity of the p-type second ridge 42a. The isolated doped regions implement an n+ source region 152a and an n+ drain region 151a of the first driver transistor $Q_{D1A}$, respectively. Therefore, the first driver transistor $Q_{D1A}$ is an n-channel MOS transistor, which includes the n+ source region 152a and the n+ drain region 151a self aligned by the first gate line 63a.

Isolated doped regions are provided in the third ridge 43a. The isolated doped regions have opposite conductivity to the conductivity of the n-type third ridge 43a. The isolated doped regions implement a p+ source region 201a and a p+ drain region 202a of the first load transistor $Q_{L1A}$, respectively. Therefore, the first load transistor $Q_{L1A}$ is a p-channel MOS transistor, which includes an n-type impurity region 65a provided in the third ridge 43a, the p+ source region 201a and the p+ drain region 202a self aligned by the first gate line 63a.

Isolated doped regions are provided in the fifth ridge 45a. The isolated doped regions have opposite conductivity to the conductivity of the p-type fifth ridge 45a. The isolated doped regions implement an n source region 58a and an n+ drain region 57a of the second driver transistor $Q_{D2A}$, respectively. Therefore, the second driver transistor $Q_{D2A}$ is an n-channel MOS transistor, which includes the n+ source region 58a and the n+ drain region 57a self aligned by the second gate line 64a.

Isolated doped regions are provided in the fourth ridge 44a. The isolated doped regions have opposite conductivity to the conductivity of the n-type fourth ridge 44a. The isolated doped regions implement a p+ source region 210a and a p+ drain region 203a of the second load transistor $Q_{L2A}$, respectively. Therefore, the second load transistor $Q_{L2A}$ is a p-channel MOS transistor, which includes an n-type impurity region 66a provided in the fourth ridge 44a, the p+ source region 210a and the p+ drain region 203a self aligned by the second gate line 64a.

The n+ drain region 151a of the first driver transistor $Q_{D1A}$, the p+ drain region 202a of the first load transistor $Q_{L1A}$, and the second gate line 64a are electrically interconnected by a drain line 25a disposed on the second ridge 42a and on the third ridge 43a.

The n+ drain region 57a of the second driver transistor $Q_{D2A}$, the p+ drain region 203a of the second load transistor $Q_{L2A}$, and the first gate line 63a are electrically interconnected by a drain line 26a disposed on the fourth ridge 44a and on the fifth ridge 45a.

Further, a first transfer transistor $Q_{T1A}$ is provided at the second ridge 42a, adjacent to the first driver transistor $Q_{D1A}$. The first transfer transistor $Q_{T1A}$ is an n-channel MOS transistor, which includes an n+ source region 150a, an n+ drain region 151a, and a gate electrode 81. The n+ source region 150a and then drain region 151a are provided in the second ridge 42a and self aligned by the gate electrode 81. The gate electrode 81 is disposed on the insulating layers 76a.

A second transfer transistor $Q_{T2A}$ is provided at the fifth ridge 45a, adjacent to the second driver transistor $Q_{D2A}$. The second transfer transistor $Q_{T2A}$ is an n-channel MOS transistor, which includes an n+ source region 56a, an n+ drain region 57a, and a gate electrode 71. The n+ source region 56a and n+ drain region 57a are provided in the fifth ridge 45a and self aligned by the gate electrode 71a. The gate electrode 71a is disposed on the insulating layers 79a.

In addition, an n+ semiconductor region 59a is provided in the first ridge 41a, adjacent to the first capacitor $C_{1A}$. An n+ semiconductor region 55a is provided in the sixth ridge 46a, adjacent to the second capacitor $C_{2A}$.

Figure 4:
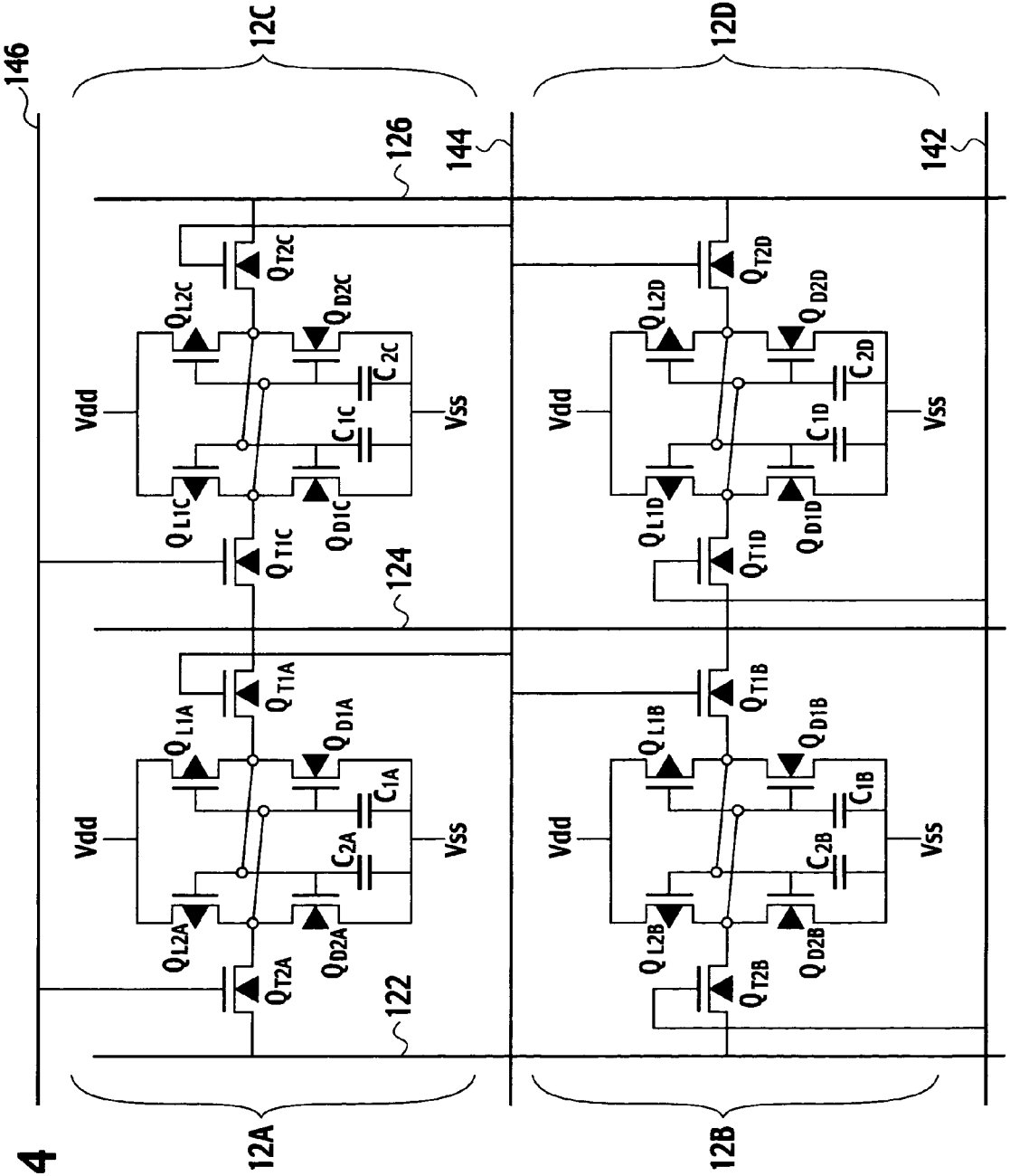
FIG. 4 is a schematic drawing of a semiconductor memory in accordance with the embodiment of the present invention.
Figure 5:
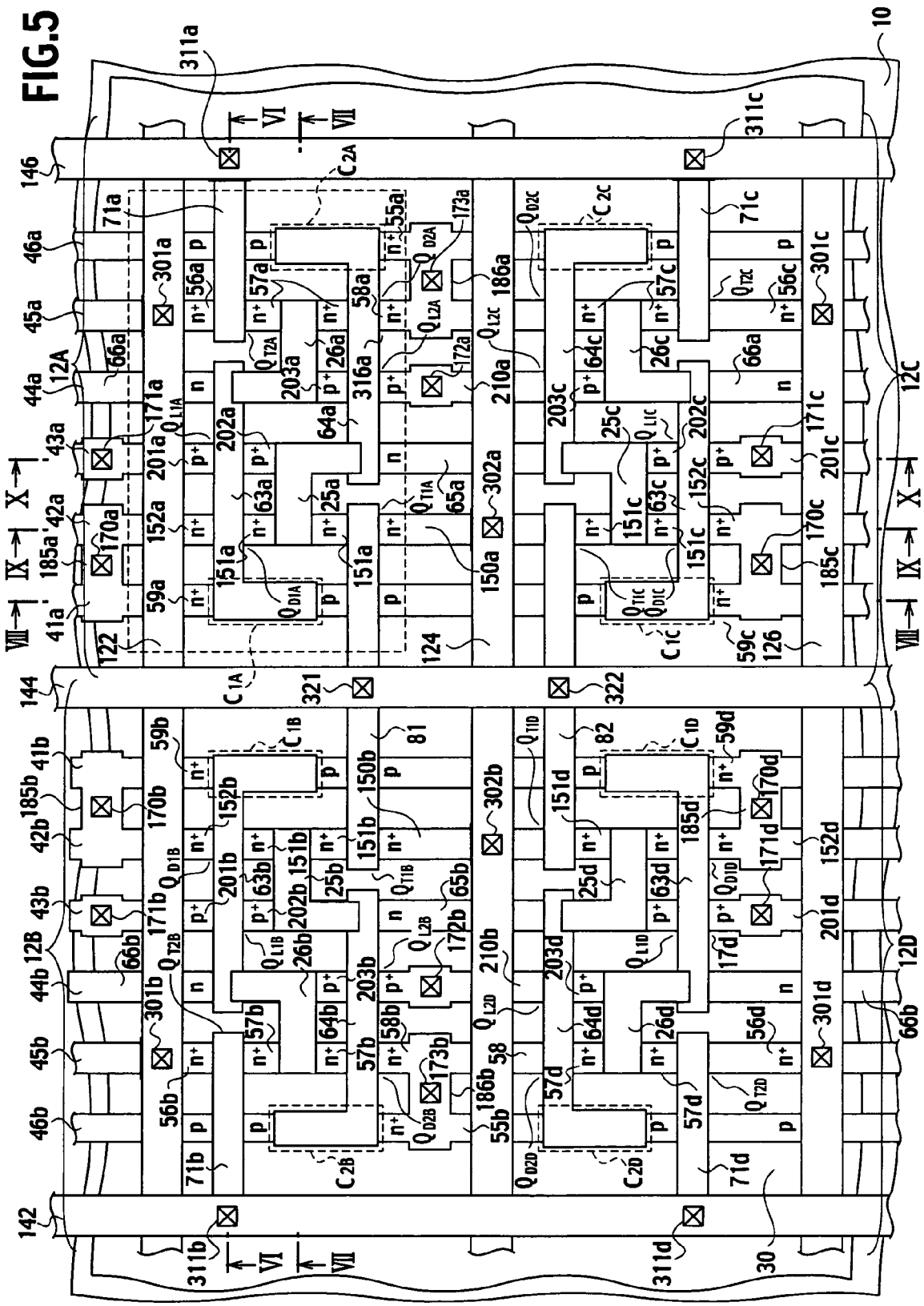
FIG. 5 is a plane view of a cell array in accordance with the embodiment of the present invention.

FIG. 4 is a circuit diagram showing a part of an SRAM cell array according to the embodiment, and FIG. 5 is a plan view of the SRAM cell array corresponding to the circuit diagram shown in FIG. 4. In FIG. 5, a portion surrounded by a dashed rectangle corresponds to the unit cell 12A shown in FIG. 2. In FIG. 5, the unit cell 12A, and unit cells 12B, 12C, and 12D, which are respectively equivalent to the unit cell 12A, are arranged in rows and columns and interconnected by metal wiring. Moreover, as shown in FIG. 6, FIG. 7, FIG. 8, FIG. 9, and FIG. 10 which respectively represent sectional views taken on VI—VI line, VII—VII line, VIII—VIII line, IX—IX line, and X—X line in FIG. 5, a first interlevel insulator 101 is disposed on the buried insulator 30. Also, a second interlevel insulator 102 is disposed on the first interlevel insulator 101, a third interlevel insulator 103 is disposed on the second interlevel insulator 102. It should be noted that FIG. 5 is a perspective view obtained by seeing through the first to third interlevel insulators 101 to 103.

Figure 8:
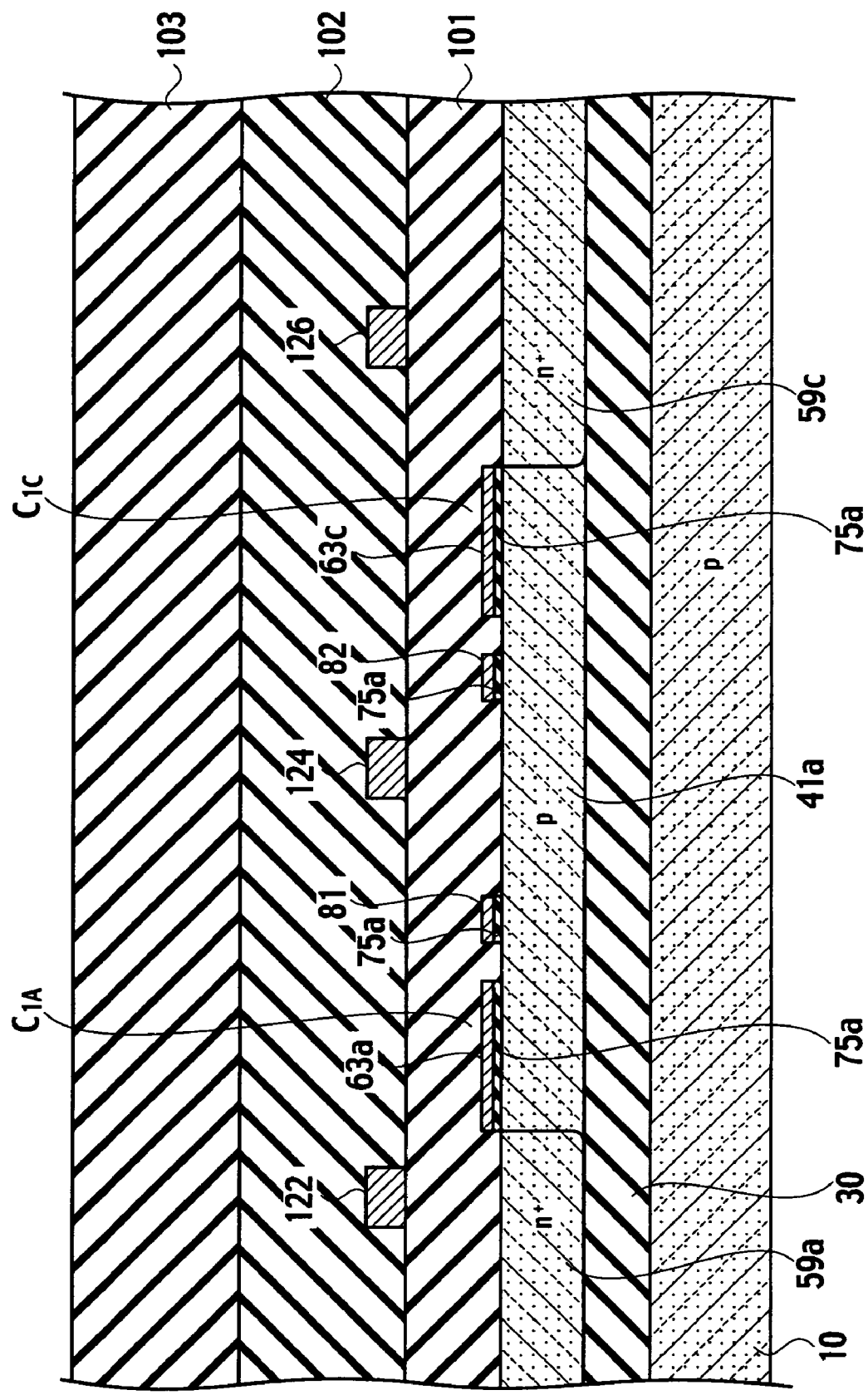
FIG. 8 is a third sectional view of the cell array in accordance with the embodiment of the present invention.
Figure 10:
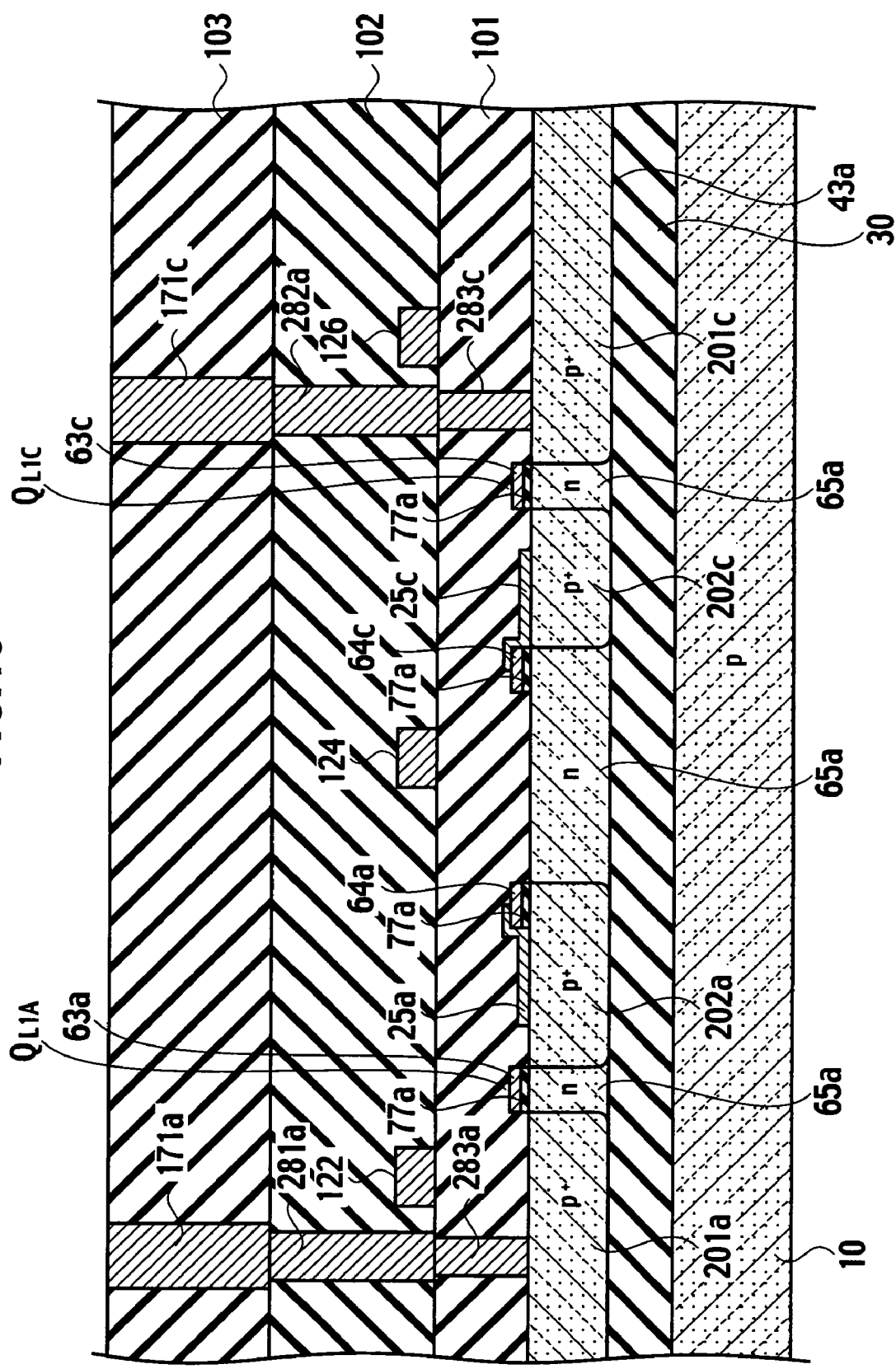
FIG. 10 is a fifth sectional view of the cell array in accordance with the embodiment of the present invention.

Here, in the unit cell 12A, the n+ semiconductor region 59a adjacent to the first capacitor $C_{1A}$ is electrically connected to the n+ source region 152a of the first driver transistor $Q_{D1A}$ by a terminal area 185a interconnecting the first ridge 41a and the second ridge 42a. A contact stud 170a to be electrically connected to a low voltage level supply (VSS) is disposed on the terminal area 185a. Moreover, as shown in FIG. 10, a contact stud 283a penetrating the first interlevel insulator 101, a contact stud 281a electrically connected to the contact stud 283a and penetrating the second interlevel insulator 102, and a contact stud 171a electrically connected to the contact stud 281a and penetrating the third interlevel insulator 103 are disposed above the p+ source region 201a of the first load transistor $Q_{L1A}$, and the p+ source region 201a is electrically connected to a high voltage level supply (VDD) through the contact studs 283a, 281a, and 171a. By adopting the above-described layout, the n+ semiconductor region 59a adjacent to the first capacitor $C_{1A}$ shown in FIGS. 5 and 8 is electrically connected to the low voltage level supply (VSS), and the first driver transistor $Q_{D1A}$ and the first load transistor $Q_{L1A}$ collectively compose a CMOS inverter.

Meanwhile, as shown in FIG. 5, the n+ semiconductor region 55a adjacent to the second capacitor $C_{2A}$ is electrically connected to the n+ source region 58a of the second driver transistor $Q_{D2A}$ by a terminal area 186a connecting the sixth ridge 46a to the fifth ridge 45a. A contact stud 173a to be electrically connected to the low voltage level supply (VSS) is disposed on the terminal area 186a. A contact stud 172a to be electrically connected to the high voltage level supply (VDD) is disposed on the p+ source region 210a of the second load transistor $Q_{L2A}$. By adopting the above-described layout, the n+ semiconductor region 55a adjacent to the second capacitor $C_{2A}$ is electrically connected to the low voltage level supply (VSS), and the second driver transistor $Q_{D2A}$ and the second load transistor $Q_{L2A}$ collectively compose a CMOS inverter.

Figure 9:
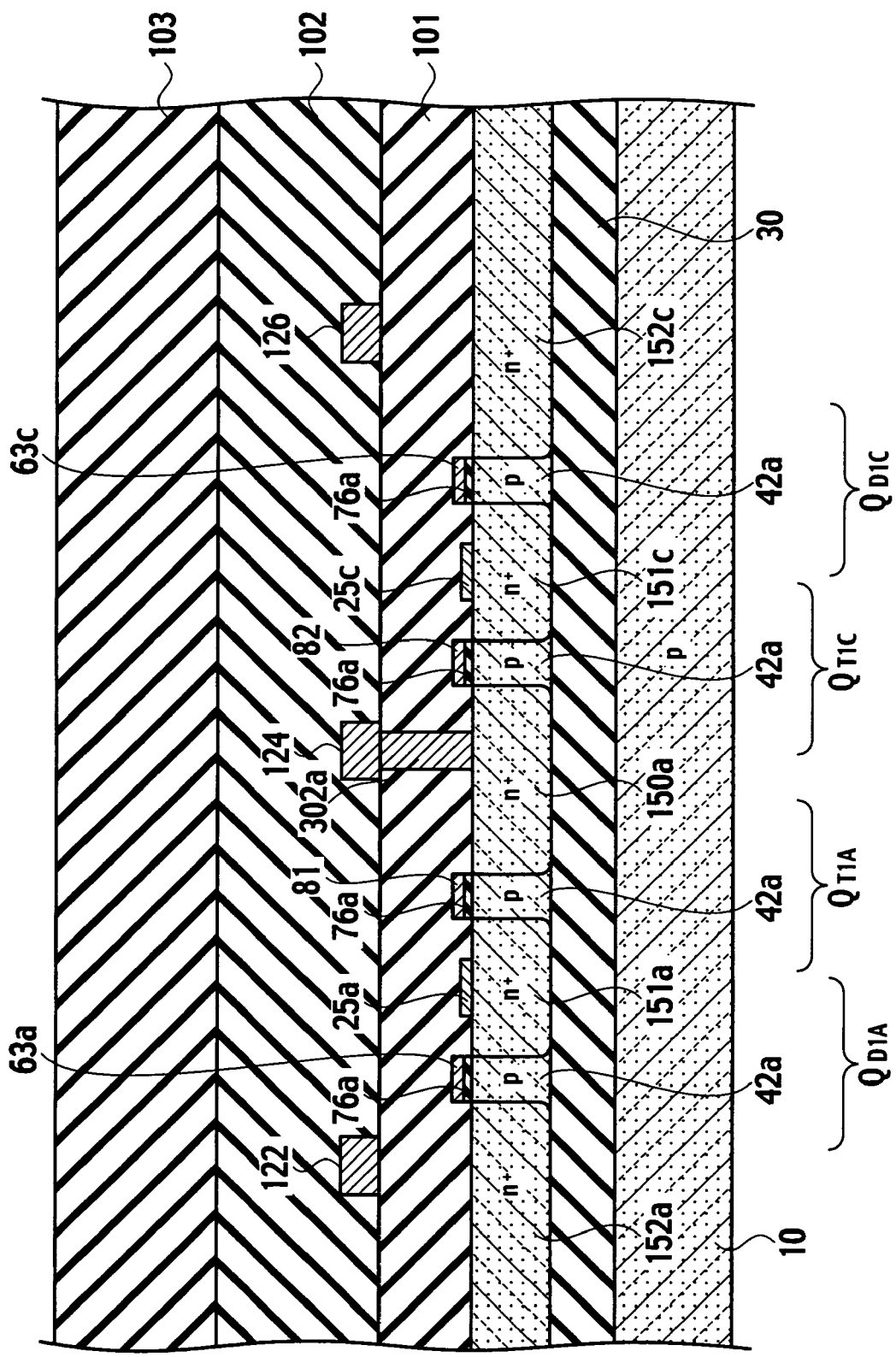
FIG. 9 is a fourth sectional view of the cell array in accordance with the embodiment of the present invention.

In addition, as shown in FIG. 9, a contact stud 302a penetrating the first interlevel insulator 101 is disposed on the n+ source region 150a of the first transfer transistor $Q_{T1A}$ which shares the n+ drain region 151a with the first driver transistor $Q_{D1A}$, and a bit line 124 electrically connected to the contact stud 302a and extending in a direction perpendicular to the first to sixth ridges 41a to 46a as shown in FIG. 5 is disposed above the first interlevel insulator 101. Meanwhile, the gate electrode 81 of the first transfer transistor $Q_{T1A}$ is electrically connected to a word line 144 through a contact stud 321. Here, as shown in FIG. 8, the gate electrode 81 and the first ridge 41a are electrically isolated owing to the insulating layer 75a disposed on the first ridge 41a.

Figure 6:
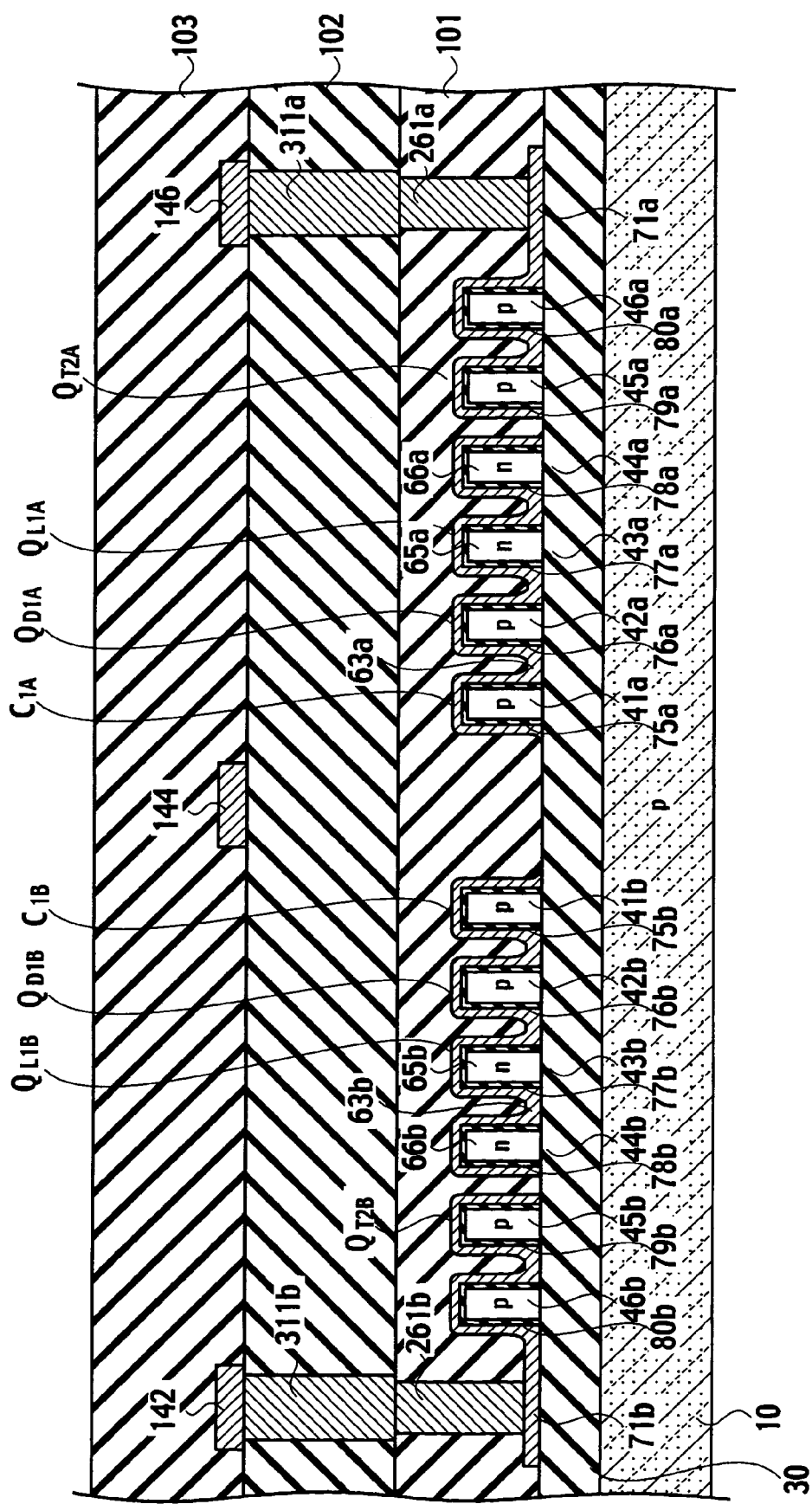
FIG. 6 is a first sectional view of the cell array in accordance with the embodiment of the present invention.

Meanwhile, as shown in FIG. 5, a contact stud 301a is disposed on the n⁺ source region 56a of the second transfer transistor $Q_{T2A}$ which shares the n⁺ drain region 57a with the second driver transistor $Q_{D2A}$, and the n⁺ source region 56a is electrically connected to a bit line 122 extending in a direction perpendicular to the first to sixth ridges 41a to 46a. Moreover, as shown in FIG. 6, a contact stud 261a penetrating the first interlevel insulator 101, and a contact stud 311a electrically connected to the contact stud 261a and penetrating the second interlevel insulator 102 are disposed above the gate electrode 71a of the second transfer transistor $Q_{T2A}$. A word line 146 extending in a direction parallel to the first to sixth ridges 41a to 46a is disposed on the second interlevel insulator 102 and is electrically connected to the gate electrode 71a through the contact studs 261a and 311a.

By adopting the above-described layout, the CMOS inverter including the first driver transistor $Q_{D1A}$ and the first load transistor $Q_{L1A}$, and the CMOS inverter including the second driver transistor $Q_{D2A}$ and the second load transistor $Q_{L2A}$ collectively compose a bistable flip-flop. Here, the first gate line 63a, the drain line 26a, and the n⁺ drain region 57a collectively compose one storage node of the unit cell 12A. Meanwhile, the second gate line 64a, the drain line 25a, and the n⁺ drain region 151a collectively compose the other storage node of the unit cell 12A.

Figure 7:
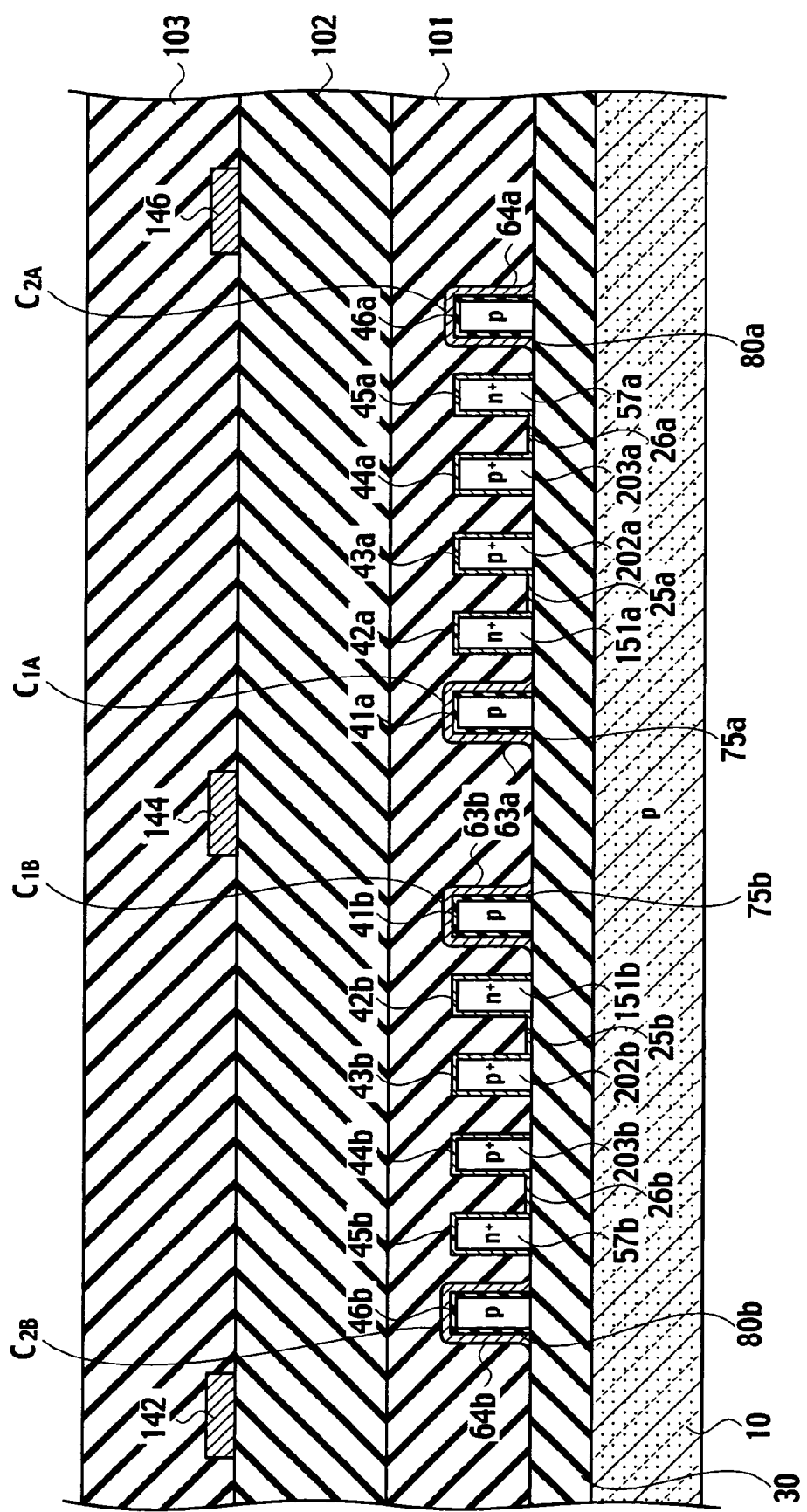
FIG. 7 is a second sectional view of the cell array in accordance with the embodiment of the present invention.

As shown in FIGS. 5 to 7, the unit cell 12B includes a first ridge 41b, a second ridge 42b, a third ridge 43b, a fourth ridge 44b, a fifth ridge 45b, and a sixth ridge 46b, which are made of a semiconductor and extending mutually parallel, insulating layers 75b, 76b, 77b, 78b, 79b, and 80b respectively disposed on the first to sixth ridges 41b to 46b, a first gate line 63b extending in a direction orthogonal to the first to sixth ridges 41b to 46b and disposed above the first to fourth ridges 41b to 44b, and a second gate line 64b extending in the direction orthogonal to the first to sixth ridges 41b to 46b and disposed above the third to sixth ridges 43b to 46b.

In the unit cell 12B, the first ridge 41b, the insulating layer 75b, and the first gate line 63b collectively implement a first capacitor $C_{1B}$. Similarly, the sixth ridge 46b, the insulating layer 80b, and the second gate line 64b collectively implement a second capacitor $C_{2B}$. Moreover, the second and third ridges 42b and 43b, the insulating layers 76b and 77b, and the first gate line 63b implement a first driver transistor $Q_{D1B}$ and a first load transistor $Q_{L1B}$. Meanwhile, the fourth and fifth ridges 44b and 45b, the insulating layers 78b and 79b, and the second gate line 64b implement a second load transistor $Q_{L2B}$ and a second driver transistor $Q_{D2B}$.

An n⁺ semiconductor region 59b is provided in the first ridge 41b, adjacent to the region where the first capacitor $C_{1B}$ is provided. The first driver transistor $Q_{D1B}$ is an n-channel MOS transistor, which includes an n⁺ drain region 151b, an n⁺ source region 152b, and the insulating layer 76b. The n⁺ drain region 151b and the n⁺ source region 152b are provided in the p-type second ridge 42b. As shown in FIG. 5, the n⁺ semiconductor region 59b is electrically connected to the n⁺ source region 152b through a terminal area 185b. A contact stud 170b to be electrically connected to the low voltage level supply (VSS) is disposed on the terminal area 185b.

The first load transistor $Q_{L1B}$ shown in FIGS. 5 and 6 is a p-channel MOS transistor including an n-type impurity region 65b, a p⁺ drain region 202b, a p⁺ source region 201b, and the insulating layer 77b. The n-type impurity region 65b, the p⁺ drain region 202b, and the p⁺ source region 201b are provided in the third ridge 43b. A contact stud 171b to be electrically connected to the high voltage level supply (VDD) is disposed on the p source region 201b. Moreover, as shown in FIGS. 5 and 7, the p⁺ drain region 202b of the first load transistor $Q_{L1B}$ is electrically connected to the n⁺ drain region 151b of the first driver transistor $Q_{D1B}$ by a drain line 25b. By adopting the above-described layout, the first driver transistor $Q_{D1B}$ and the first load transistor $Q_{L1B}$ collectively compose a CMOS inverter.

Meanwhile, an n⁺ semiconductor region 55b is provided in the sixth ridge 46b, adjacent to the region where the second capacitor $C_{2B}$ is provided. The second driver transistor $Q_{D2B}$ is an n-channel MOS transistor, which includes an n⁺ drain region 57b and an n⁺ source region 58b provided in the p-type fifth ridge 45b. The n⁺ semiconductor region 55b is electrically connected to the n⁺ source region 58b through a terminal area 186b. A contact stud 173b to be electrically connected to the low voltage level supply (VSS) is disposed on the terminal area 186b.

The second load transistor $Q_{L2B}$ is a p-channel MOS transistor including a p⁺ drain region 203b and a p⁺ source region 210b, which are provided in the fourth ridge 44b. A contact stud 172b to be electrically connected to the high voltage level supply (VDD) is disposed on the p⁺ source region 210b. The p⁺ drain region 203b of the second load transistor $Q_{L2B}$ is electrically connected to the n⁺ drain region 57b of the second driver transistor $Q_{D2B}$ by a drain line 26b. By adopting the above-described layout, the second driver transistor $Q_{D2B}$ and the second load transistor $Q_{L2B}$ collectively compose a CMOS inverter.

In addition, a first transfer transistor $Q_{T1B}$, which is an n-channel MOS transistor including an n⁺ source region 150b, the n⁺ drain region 151b, and the gate electrode 81, is provided at the second ridge 42b. A contact stud 302b is disposed on the source region 150b of the first transfer transistor $Q_{T1B}$, whereby the source region 150b is electrically connected to the bit line 124. Here, the first transfer transistor $Q_{T1B}$ shares the gate electrode 81 with the first transfer transistor $Q_{T1A}$ of the unit cell 12A, and is electrically connected to the word line 144.

Meanwhile, as shown in FIGS. 5 and 6, a second transfer transistor $Q_{T2B}$, which is an n-channel MOS transistor including an n⁺ source region 56b, the n⁺ drain region 57b, and a gate electrode 71b, is provided at the p-type fifth ridge 45b. As shown in FIG. 5, a contact stud 301b is disposed on the source region 56b of the second transfer transistor $Q_{T2B}$, whereby the source region 56b is electrically connected to the bit line 122. Moreover, as shown in FIGS. 5 and 6, a contact stud 261b penetrating the first interlevel insulator 101, and a contact stud 311b electrically connected to the contact stud 261b and penetrating the second interlevel insulator 102 are disposed above the gate electrode 71b of the second transfer transistor $Q_{T2B}$. The gate electrode 71b is electrically connected to a word line 142 through the contact studs 261b and 311b.

In addition, the n⁺ drain region 151b of the first driver transistor $Q_{D1B}$, the p⁺ drain region 202b of the first load transistor $Q_{L1B}$, and the second gate line 64b are electrically interconnected by a drain line 25b disposed above the second ridge 42b and above the third ridge 43b.

Meanwhile, the n⁺ drain region 57b of the second driver transistor $Q_{D2B}$, the p⁺ drain region 203b of the second load transistor $Q_{L2B}$, and the first gate line 63b are electrically interconnected by a drain line 26b disposed above the fourth ridge 44b and above the fifth ridge 45b.

By adopting the above-described layout, the CMOS inverter including the first driver transistor $Q_{D1B}$ and the first load transistor $Q_{L1B}$, and the CMOS inverter including the second driver transistor $Q_{D2B}$ and the second load transistor $Q_{L2B}$ collectively compose a bistable flip-flop. Here, the first gate line 63b, the drain line 26b, and the n$^+$ drain region 57b collectively compose one storage node of the unit cell 12B. Meanwhile, the second gate line 64b, the drain line 25b, and the n$^+$ drain region 151b collectively compose the other storage node of the unit cell 12B.

The unit cell 12C shown in FIGS. 5, 8, 9 and 10 includes the first ridge 41a, the second ridge 42a, the third ridge 43a, the fourth ridge 44a, the fifth ridge 45a, the sixth ridge 46a, a first capacitor $C_{1C}$ provided at the first ridge 41a, a first transfer transistor $Q_{T1C}$ and a first driver transistor $Q_{D1C}$ provided at the second ridge 42a, a first load transistor $Q_{L1C}$ provided at the third ridge 43a, a second load transistor $Q_{L2C}$ provided at the fourth ridge 44a, a second transfer transistor $Q_{T2C}$ and a second driver transistor $Q_{D2C}$ provided at the fifth ridge 45a, and a second capacitor $C_{2C}$ provided at the sixth ridge 46a.

The first capacitor $C_{1C}$ provided at the first ridge 41a as shown in FIGS. 5 and 8 includes the insulating layer 75a and a first gate line 63c. Meanwhile, an n$^+$ semiconductor region 59c is disposed in the first ridge 41a, adjacent to the region where the first capacitor $C_{1C}$ is provided. The first driver transistor $Q_{D1C}$ provided at the second ridge 42a as shown in FIGS. 5 and 9 is an n-channel MOS transistor, which includes an n$^+$ drain region 151c, an n$^+$ source region 152c, the insulating layer 76a, and the first gate line 63c. The n$^+$ source region 152c is electrically connected to the n$^+$ semiconductor region 59c through a terminal area 185c. A contact stud 170c to be electrically connected to the low voltage level supply (VSS) is disposed on the terminal area 185c.

The first load transistor $Q_{L1C}$ provided at the third ridge 43a as shown in FIGS. 5 and 10 is a p-channel MOS transistor including the n-type impurity region 65a, a p$^+$ drain region 202c, a p$^+$ source region 201c, the insulating layer 77a, and the first gate line 63c. The contact stud 283a penetrating the first interlevel insulator 101, the contact stud 281a electrically connected to the contact stud 283a and penetrating the second interlevel insulator 102, and a contact stud 171c electrically connected to the contact stud 281a and penetrating the third interlevel insulator 103 are disposed above the p$^+$ source region 201c, and the p$^+$ source region 201c is electrically connected to the high voltage level supply (VDD). The p$^+$ drain region 202c of the first load transistor $Q_{L1C}$ is electrically connected to the n$^+$ drain region 151c of the first driver transistor $Q_{D1C}$ by a drain line 25c.

The first transfer transistor $Q_{T1C}$ provided at the second ridge 42a as shown in FIGS. 5 and 9 is an n-channel MOS transistor, which includes the n$^+$ source region 150a, the n$^+$ drain region 151c, the insulating layer 76a, and a gate electrode 82. A contact stud 322 is disposed on the gate electrode 82, and the gate electrode 82 is electrically connected to the word line 144.

Meanwhile, the second capacitor $C_{2C}$ provided at the sixth ridge 46a as shown in FIG. 5 includes a second gate line 64c. Moreover, the n+semiconductor region 55a is provided in the sixth ridge 46a, adjacent to the region where the second capacitor $C_{2C}$ is provided. The second driver transistor $Q_{D2C}$ provided at the fifth ridge 45a is an n-channel MOS transistor, which includes an n$^+$ drain region 57c, the n$^+$ source region 58a, and the second gate line 64c.

The second load transistor $Q_{L2C}$ provided at the fourth ridge 44a is a p-channel MOS transistor, which includes a p$^+$ drain region 203c, a p$^+$ source region 210c, and the second gate line 64c. The p$^+$ drain region 203c of the second load transistor $Q_{L2C}$ is electrically connected to the n$^+$ drain region 57c of the second driver transistor $Q_{D2C}$ by a drain line 26c.

In addition, the second transfer transistor $Q_{T2C}$ provided at the fifth ridge 45a is an n-channel MOS transistor, which includes an n$^+$ source region 56c, the n$^+$ drain region 57c, and a gate electrode 71c. A contact stud 301c is disposed on the n$^+$ source region 56c, whereby the n$^+$ source region 56c is electrically connected to a bit line 126. A contact stud 311c is disposed on the gate electrode 71c, whereby the gate electrode 71c is electrically connected to the word line 146

The unit cell 12D shown in FIG. 5 includes the first ridge 41b, the second ridge 42b, the third ridge 43b, the fourth ridge 44b, the fifth ridge 45b, the sixth ridge 46b, a first capacitor $C_{1D}$ provided at the first ridge 41b, a first transfer transistor $Q_{T1D}$ and a first driver transistor $Q_{D1D}$ provided at the second ridge 42b, a first load transistor $Q_{L1D}$ provided at the third ridge 43b, a second load transistor $Q_{L2D}$ provided at the fourth ridge 44b, a second transfer transistor $Q_{T2D}$ and a second driver transistor $Q_{D2D}$ provided at the fifth ridge 45b, and a second capacitor $C_{2D}$ provided at the sixth ridge 46b.

The first capacitor $C_{1D}$ provided at the first ridge 41b includes a first gate line 63d. Meanwhile, an n$^+$ semiconductor region 59d is provided in the first ridge 41b, adjacent to the region where the first capacitor $C_{1D}$ is provided. The first driver transistor $Q_{D1D}$ provided at the second ridge 42b is an n-channel MOS transistor, which includes an n$^+$ drain region 151d, an n$^+$ source region 152d, and the first gate line 63d. The n$^+$ semiconductor region 59d is electrically connected to the n$^+$ source region 152d through a terminal area 185d.

The first load transistor $Q_{L1D}$ provided at the third ridge 43b is a p-channel MOS transistor including a p$^+$ drain region 202d, a p$^+$ source region 201d, and the first gate line 63d. The p$^+$ drain region 202d of the first load transistor $Q_{L1D}$ is electrically connected to the n$^+$ drain region 151d of the first driver transistor $Q_{D1D}$ by a drain line 25d.

The first transfer transistor $Q_{T1D}$ provided at the second ridge 42b is an n-channel MOS transistor, which includes the n$^+$ source region 150b, the n$^+$ drain region 151d, and the gate electrode 82.

Meanwhile, the second capacitor $C_{2D}$ provided at the sixth ridge 46b includes a second gate line 64d. Moreover, the n$^+$ semiconductor region 55b is provided in the sixth ridge 46b, adjacent to the region where the second capacitor $C_{2D}$ is disposed. The second driver transistor $Q_{D2D}$ provided at the fifth ridge 45b is an n-channel MOS transistor, which includes an n$^+$ drain region 57d, the n$^+$ source region 58b, and the second gate line 64d.

The second load transistor $Q_{L2D}$ provided at the fourth ridge 44b is a p-channel MOS transistor, which includes a p$^+$ drain region 203d, a p$^+$ source region 210d, and the second gate line 64d. The p$^+$ drain region 203d of the second load transistor $Q_{L2D}$ is electrically connected to the n$^+$ drain region 57d of the second driver transistor $Q_{D2D}$ by a drain line 26d.

The second transfer transistor $Q_{T2C}$ is an n-channel MOS transistor, which includes the fifth ridge 45b, an n$^+$ source region 56d, the n$^+$ drain region 57d, and a gate electrode 71d. A contact stud 301d is disposed on the source region 56d, whereby the n$^+$ source region 56d is electrically connected to the bit line 126. Meanwhile, a contact stud 311d is disposed on the gate electrode 71d, whereby the gate electrode 71d is electrically connected to the word line 142.

In the semiconductor memory shown in FIGS. 5 to 10, it is possible to use single-crystal silicon (Si) or the like as the material for the semiconductor substrate 10. As the materials used respectively for the contact studs 170a, 170b, 170c, 170d, 171a, 171b, 171c, 171d, 261a, 261b, 281a, 281c, 283a, 283b, 301a, 301b, 301c, 301d, 302a, 302b, 311a, 311b, 311c, 311d, 321, and 322, the bit lines 122, 124, and 126, and the word lines 142, 144, and 146, it is possible to use metal such as aluminum (Al) and copper (Cu), an aluminum alloy (such as Ai—Si and Al—Cu—Si), refractory metal such as molybdenum (Mo) and tungsten (W), silicides of the refractory metal (such as $MoSi_2$ and $WSi_2$), or the like. Meanwhile, a single layer made of polycrystalline silicone or a double layer formed by depositing a silicide layer on a polycrystalline silicon layer, for example, can be used for the first gate lines 63a, 63b, 63c, and 63d, the second gate lines 64a, 64b, 64c, and 64d, and the gate electrodes 71a, 71b, 71c, 71d, 81 and 82 respectively. As the material for each of the first interlevel insulator 101, the second interlevel insulator 102, and the third interlevel insulator 103, it is possible to use an inorganic insulating material such as silicon dioxide ($SiO_2$), carbon-incorporated silicon oxide (SiOC), fluorine-incorporated silicon oxide (SiOF), a so-called low dielectric (low-k) material such as silicon dioxide hydrogen silsesquioxane (HSQ) and other organic polymers, or the like.

In the above-described semiconductor memory according to the embodiment, as shown in FIGS. 4 and 5, the one storage node in the unit cell 12A having the $n^+$ drain region 57a of the second driver transistor $Q_{D2A}$ includes the first capacitor $C_{1A}$. In addition, the first capacitor $C_{1A}$ is electrically connected to the low voltage level supply (VSS) through the $n^+$ semiconductor region 59a. Therefore, even if electrons are generated in the $n^+$ drain region 57a due to the impingement of alpha particles or the like into the semiconductor memory, it is possible to effectively absorb the generated electrons by the first capacitor $C_{1A}$. Consequently, it is possible to effectively prevent soft errors. A similar effectiveness is achieved in the other storage node having the $n^+$ drain region 151a of the first driver transistor $Q_{D1A}$, owing to the second capacitor $C_{2A}$. Moreover, in terms of the respective unit cells 12B, 12C, and 12D, it is possible to prevent soft errors, owing to the first capacitors $C_{1B}$, $C_{1C}$, and $C_{1D}$, and the second capacitors $C_{2B}$, $C_{2C}$, and $C_{2D}$.

Furthermore, the first ridges 41a and 41b, and the sixth ridges 46a and 46b, where the first capacitors $C_{1A}$, $C_{1B}$, $C_{1C}$, and $C_{1D}$ and the second capacitors $C_{1B}$, $C_{2B}$, $C_{2C}$, and $C_{2D}$ are provided, have been provided for the purpose of dealing with lithographic errors in the manufacturing process of semiconductor memory. Therefore, according to the semiconductor memory of the embodiment, it is possible to suppress soft errors by the first capacitors $C_{1A}$, $C_{1B}$, $C_{1C}$, and $C_{1D}$, and the second capacitors $C_{1B}$, $C_{2B}$, $C_{2C}$, and $C_{2D}$ without causing an increase in the cell area as compared to earlier semiconductor memories.

Here, in the example shown in FIG. 2 and FIGS. 5 to 7, the respective unit cells 12A to 12C include six ridges of the first to sixth ridges 41a to 46a or 41b to 46b. However, the embodiment of the present invention is not limited to the unit cells including six ridges. In respect of effective utilization of ridges on both ends inside a unit cell disposed for the purpose of dealing with lithographic errors, the present invention is also applicable to a unit cell including six or more ridges.

With reference next to FIGS. 11 to 32, a method for manufacturing the semiconductor memory is described.

Figure 11:
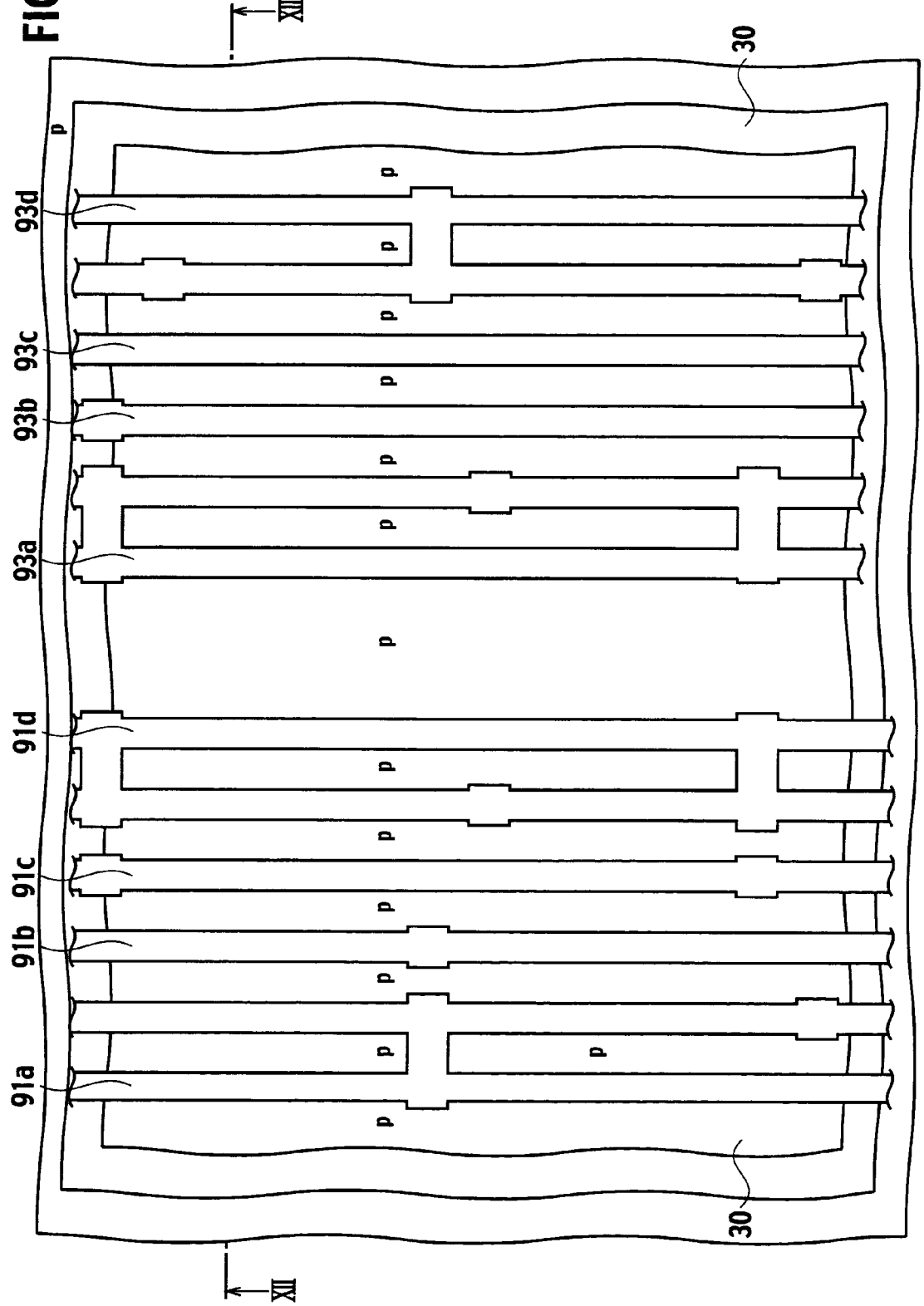
FIG. 11 is a first plane view of the cell array depicting a manufacturing process in accordance with the embodiment of the present invention.
Figure 12:
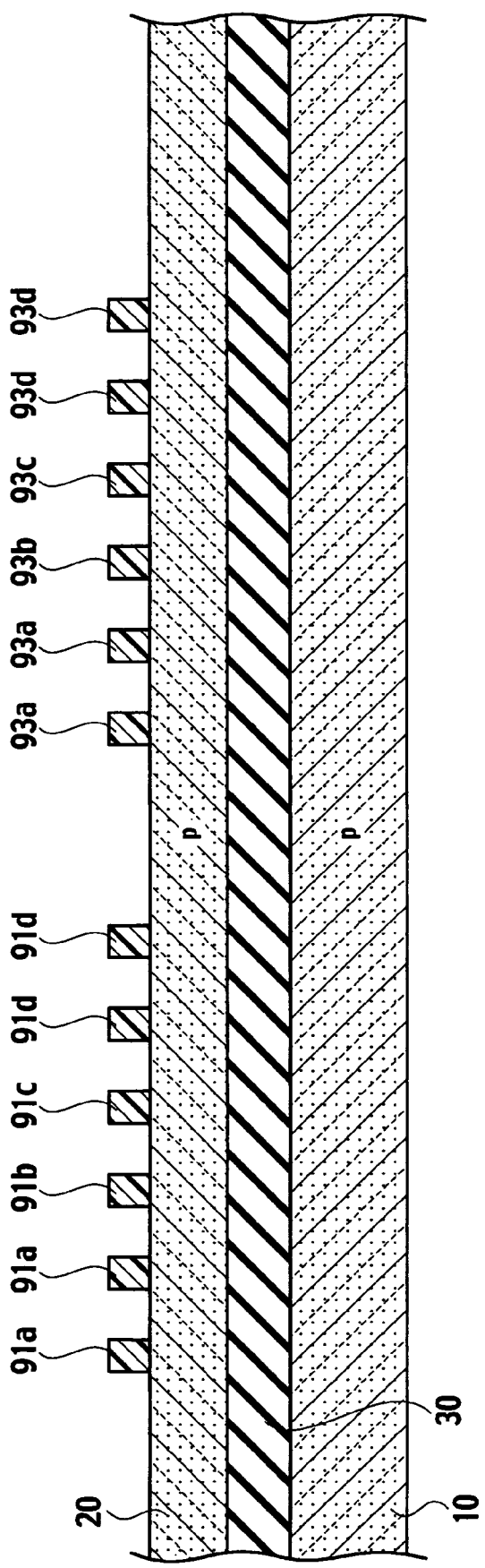
FIG. 12 is a first sectional view of the cell array depicting the manufacturing process in accordance with the embodiment of the present invention.

As shown in FIG. 11 and FIG. 12 which is a sectional view taken on line XII—XII in FIG. 12, the buried insulator 30 and a p-type semiconductor layer 20 on the buried insulator 30 are formed using thermal oxidization or furnace processing for example after oxygen ions are doped into the p-type semiconductor substrate 10. The semiconductor layer 20 is composed of Si, for example.

A photoresist is applied to the surface of the p-type semiconductor layer 20 to define a pattern through use of optical lithography to produce chemical etchant masks 91a, 91b, 91c, 91d, 93a, 93b, 93c, 93d. After the chemical etchant masks 91a–93d are defined, an etch process is employed to selectively remove the semiconductor layer 20 with the etching stop on the buried insulator 30.

Figure 13:
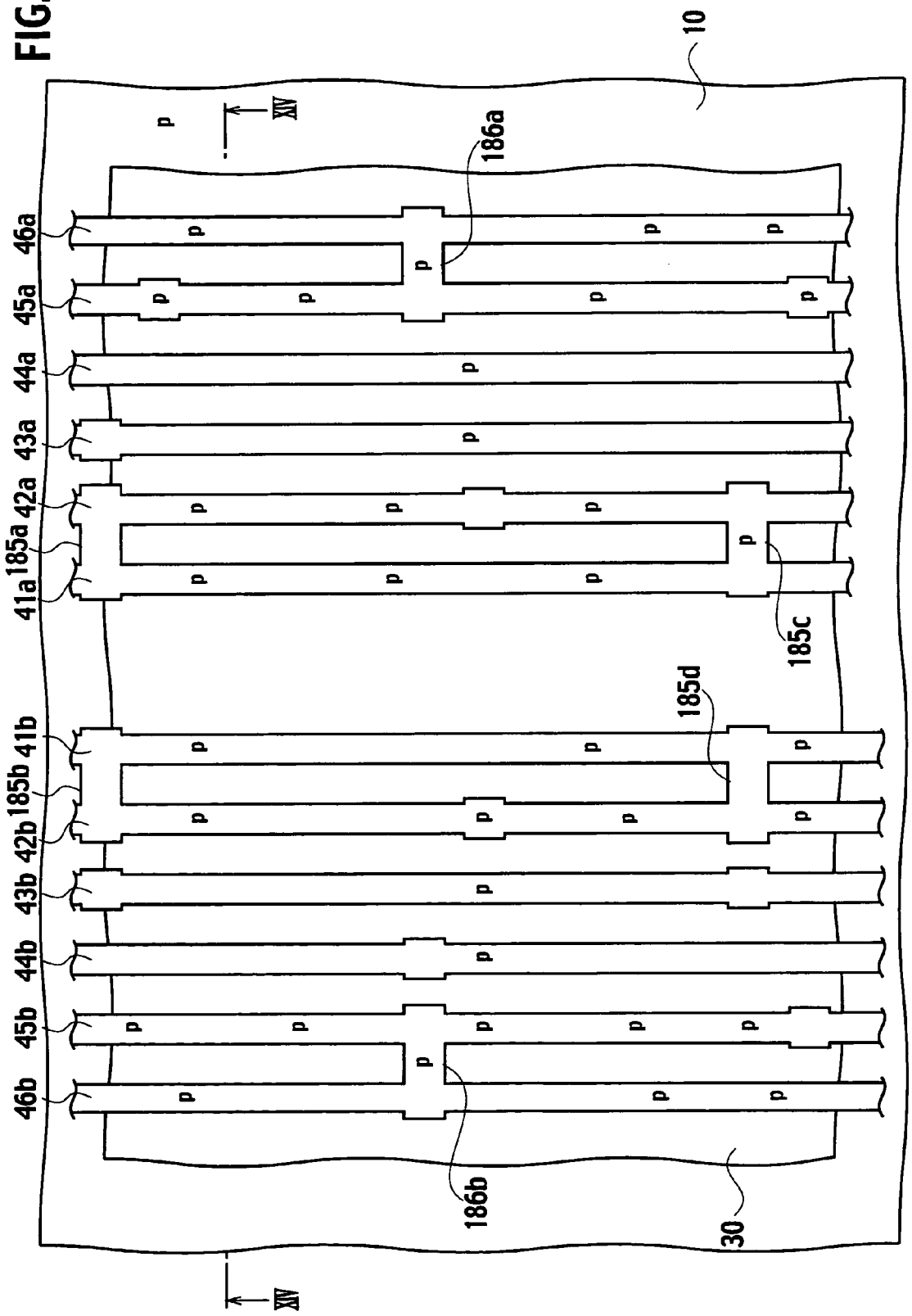
FIG. 13 is a second plane view of the cell array depicting the manufacturing process in accordance with the embodiment of the present invention.
Figure 14:
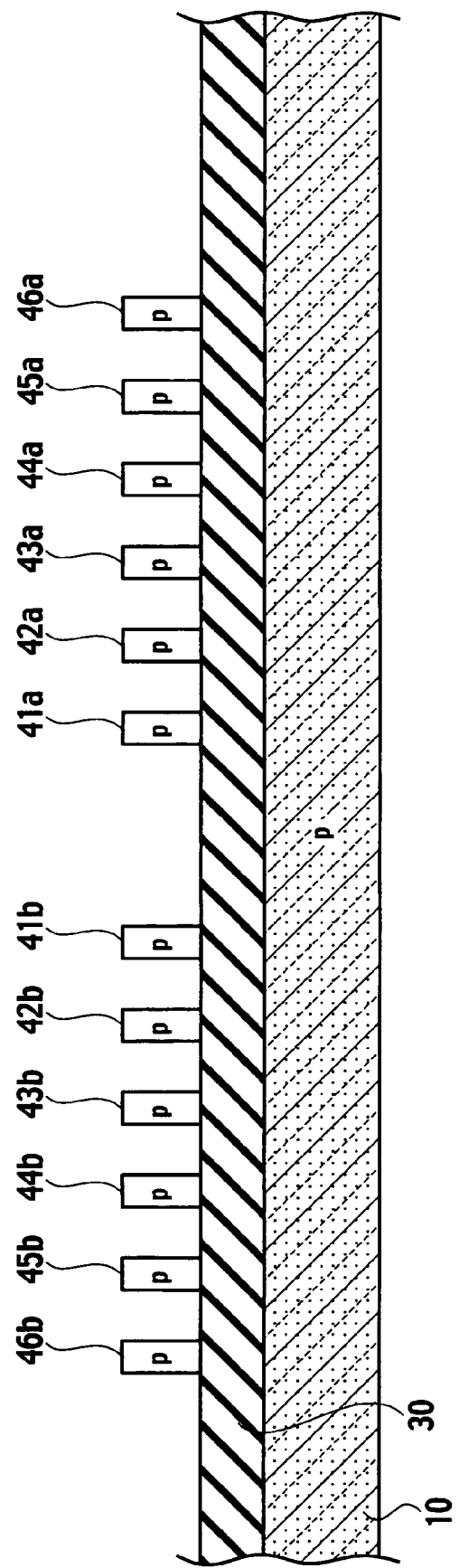
FIG. 14 is a second sectional view of the cell array depicting the manufacturing process in accordance with the embodiment of the present invention.

After the chemical etchant masks 91a–93d are removed, as shown in FIG. 13 and FIG. 14 which is a sectional view taken on line XIV—XIV in FIG. 13, the first ridges 41a and 41b, the second ridges 42a and 42b, the third ridges 43a and 43b, the fifth ridges 45a and 45b, the fourth ridges 44a and 44b, the sixth ridges 46a and 46b, and the terminal areas 185a–185d, 186a and 186b are formed.

Figure 15:
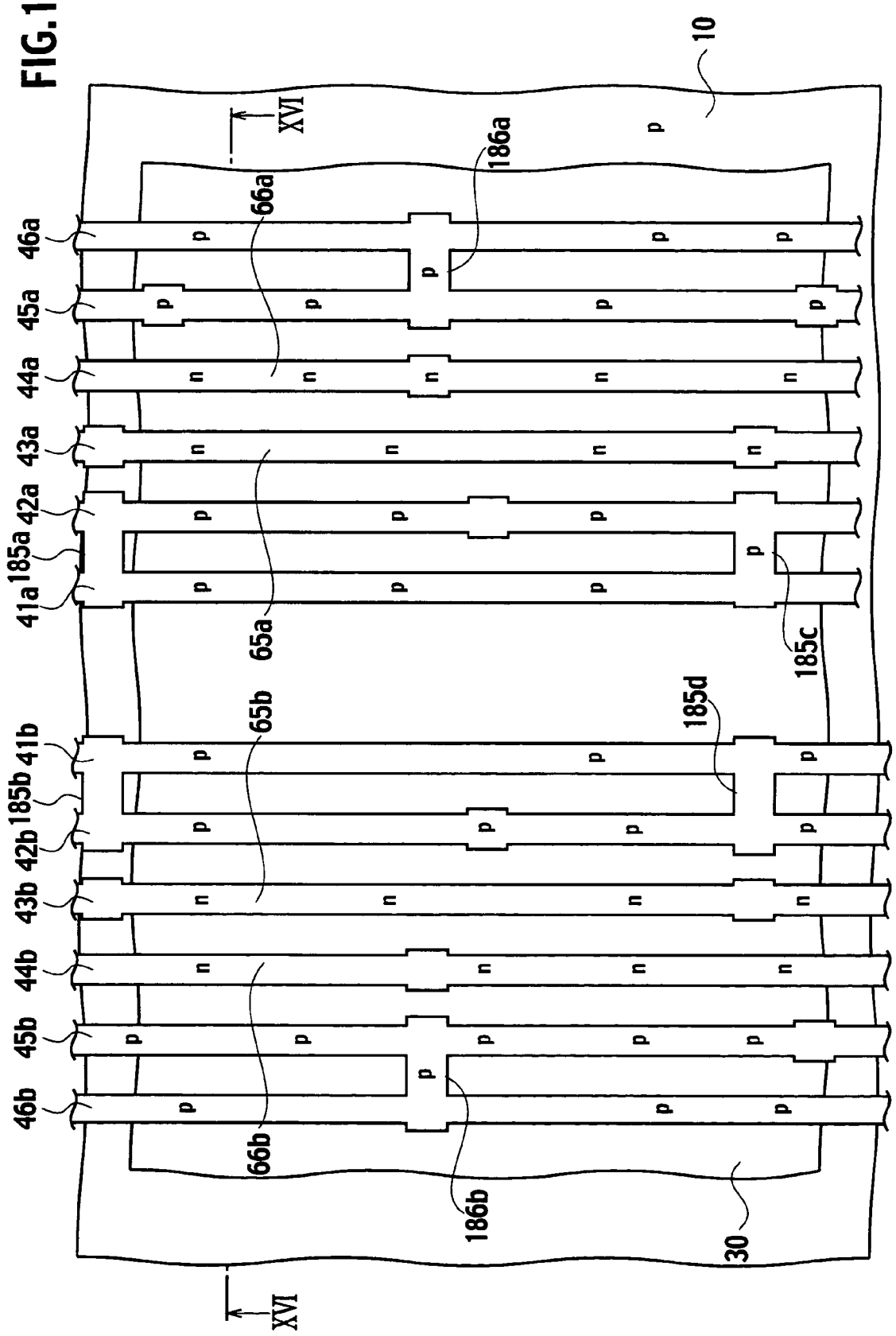
FIG. 15 is a third plane view of the cell array depicting the manufacturing process in accordance with the embodiment of the present invention.
Figure 16:
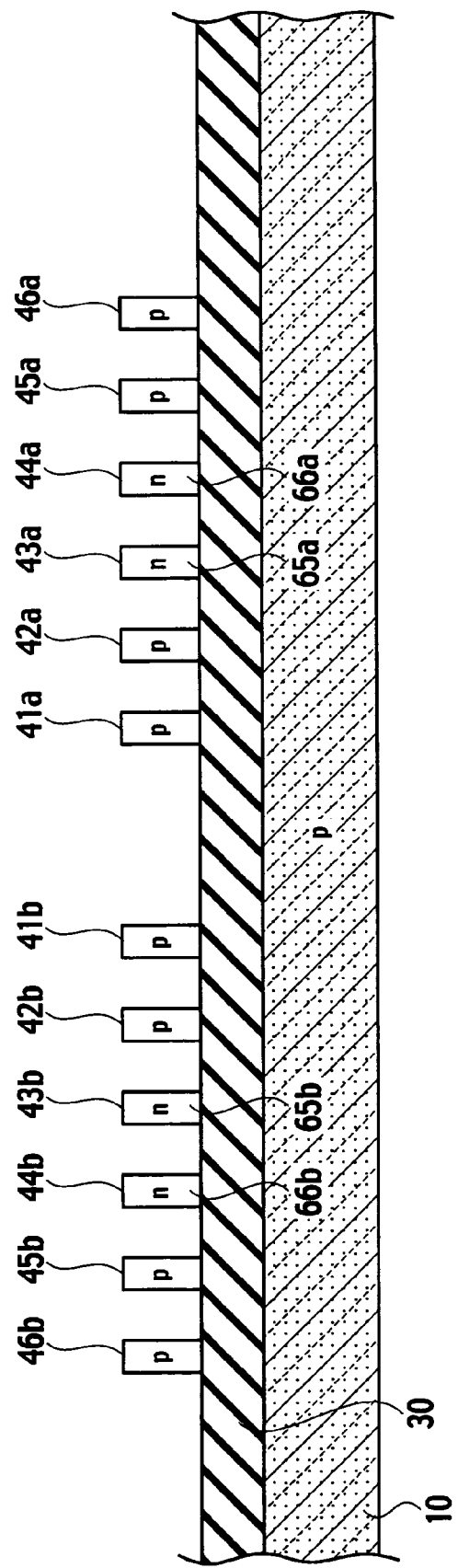
FIG. 16 is a third sectional view of the cell array depicting the manufacturing process in accordance with the embodiment of the present invention.

A first mask resist capping the first ridges 41a and 41b, the second ridges 42a and 42b, the sixth ridges 46a and 46b, and the fifth ridges 45a and 45b is formed through use of optical lithography. Thereafter, the third ridges 43a and 43b and the fourth ridges 44a and 44b are selectively doped with N-type dopants as first dopants. Phosphorus ions ($P^+$) and Arsenic ions ($As^+$) can be used for the first dopants, for example. After the first mask resist is removed by ash process, the doped first dopants are annealed and first silicon oxide layers overlying the first to sixth ridges 41a–46a and 41b–46b, and the terminal areas 185a–185d, 186a, and 186b are formed. After the first silicon oxide layers are removed, as shown in FIG. 15 and FIG. 16 which is a sectional view taken on line XVI—XVI in FIG. 15, the n-type impurity regions 65a, 65b, 66a, 66b are formed in the third ridges 43a, 43b, and the fourth ridges 44a, 44b.

Figure 17:
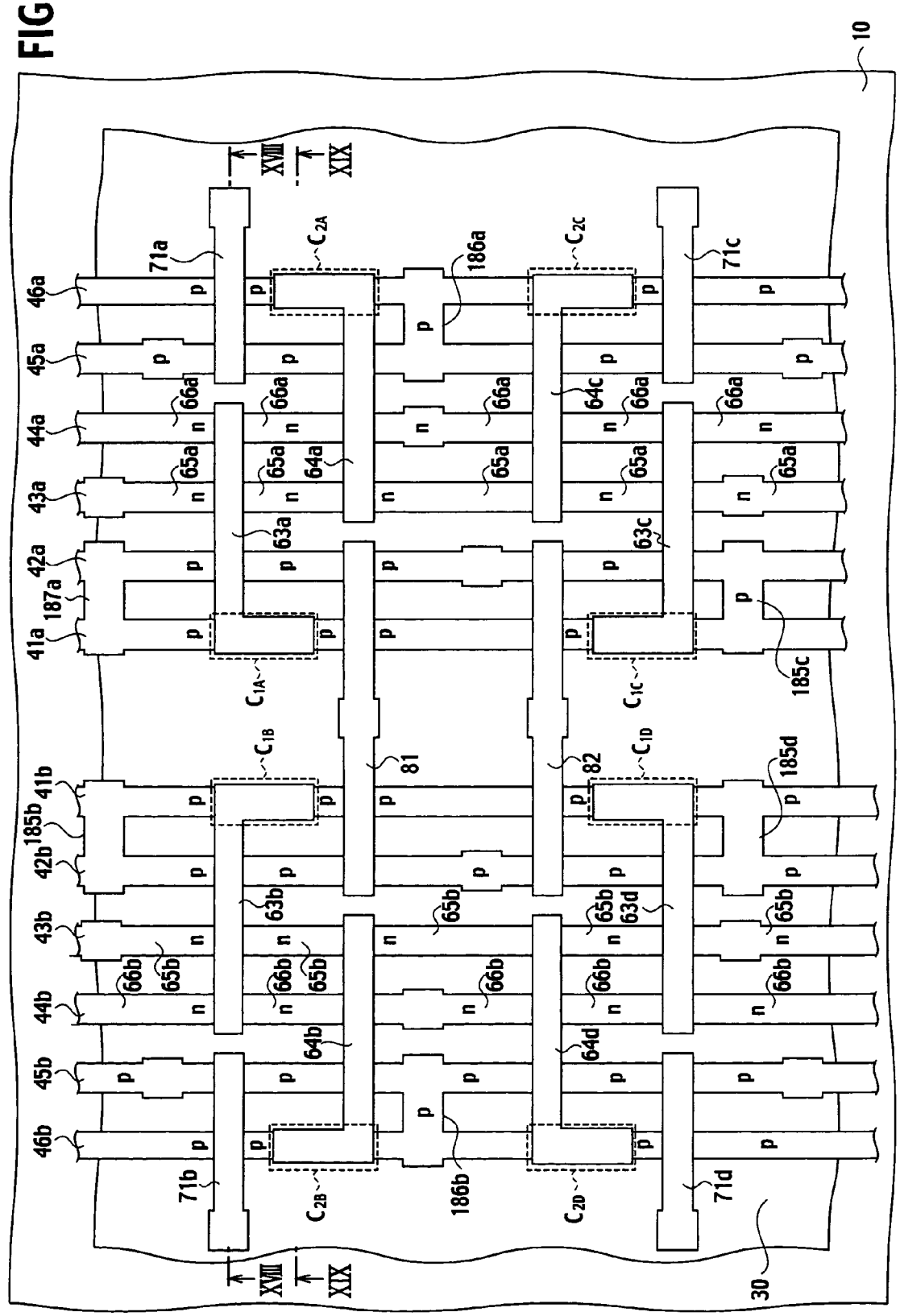
FIG. 17 is a fourth plane view of the cell array depicting the manufacturing process in accordance with the embodiment of the present invention.
Figure 18:
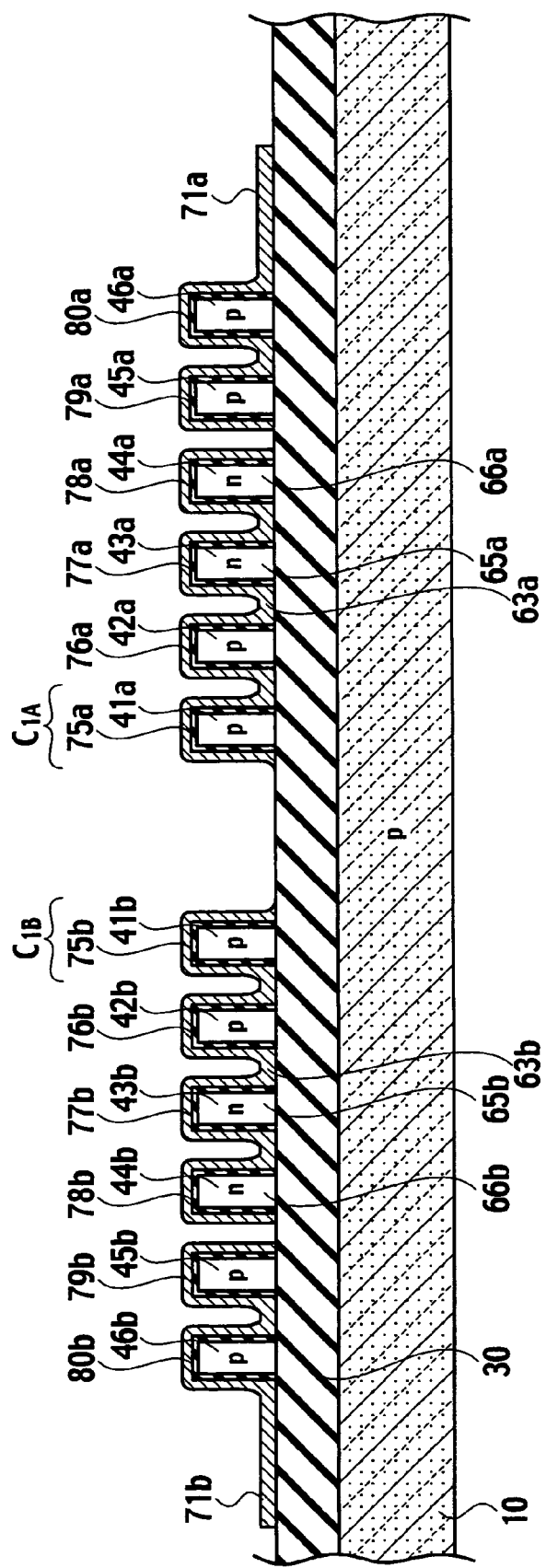
FIG. 18 is a fourth sectional view of the cell array depicting the manufacturing process in accordance with the embodiment of the present invention.
Figure 19:
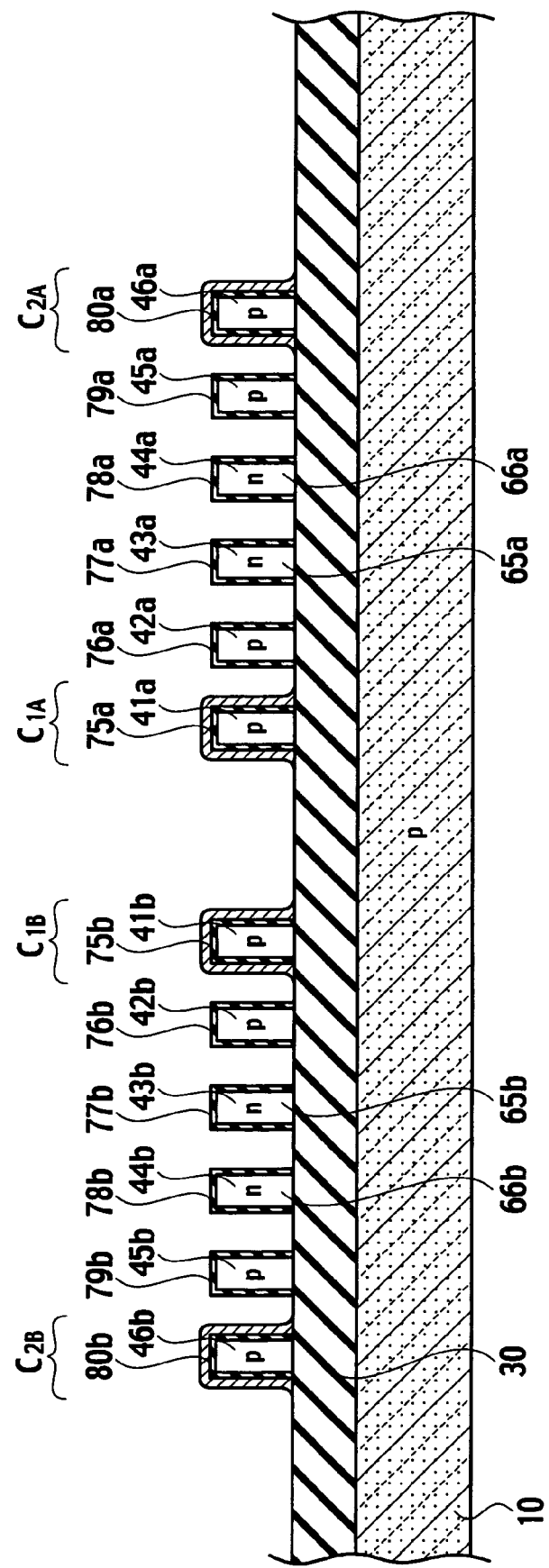
FIG. 19 is a fifth sectional view of the cell array depicting the manufacturing process in accordance with the embodiment of the present invention.

The insulating layers 75a–80b overlying the first ridges 41a, 41b, the second ridges 42a, 42b, the third ridges 43a, 43b, the fifth ridges 45a, 45b, the fourth ridges 44a, 44b, the sixth ridges 46a, 46b, and the terminal areas 185a–185d, 186a, 186b are grown by the thermal oxidation. Then, a first polycrystalline silicon layer is deposited on the buried insulator 30 by Chemical Vapor Deposition (CVD) process. Thereafter, the first polycrystalline silicon layer is selectively removed by use of the optical lithography and the anisotropic etch process. Accordingly, as shown in FIG. 17, FIG. 18 which is a sectional view taken on line XVIII—XVIII in FIG. 17, and FIG. 19 which is a sectional view taken on line XIX—XIX in FIG. 17, the first gate lines 63a–63d, the second gate lines 64a–64d, the gate electrodes 71a–71d, 81, 82 are formed. Consequently, the first capacitors $C_{1A}$, $C_{1B}$, $C_{1C}$, $C_{1D}$ and the second capacitors $C_{2A}$, $C_{2B}$, $C_{2C}$, $C_{2D}$ are provided at the first ridges 41a, 41b and the sixth ridges 46a, 46b. It should be noted that the FIG. 17 is a perspective view through the insulating layers 75a–80a, 75b–80b.

A second mask resist is formed and the first ridges 41a, 41b, the second ridges 42a, 42b, the fifth ridges 45a, 45b, and the portion of the sixth ridges 46a, 46b are doped with the first dopants using the first gate lines 63a–63d, the second gate lines 64a–64d, and the gate electrodes 71a–71d, 81, 82 as a doping mask. The second mask resist is removed by the ash process.

A third mask resist is formed and the third ridges 43a, 43b and the fourth ridges 44a, 44b are selectively doped with P-type dopants as second dopants using the first gate lines 63a–63d, the second gate lines 64a–64d, and the gate electrodes 71a–71d, 81, 82 as the doping mask. Boron ions (B) can be used for the second dopants. Thereafter, the insulating layers 75a–80a, 75b–80b are selectively removed and the third mask resist is removed by the ash process.

Figure 20:
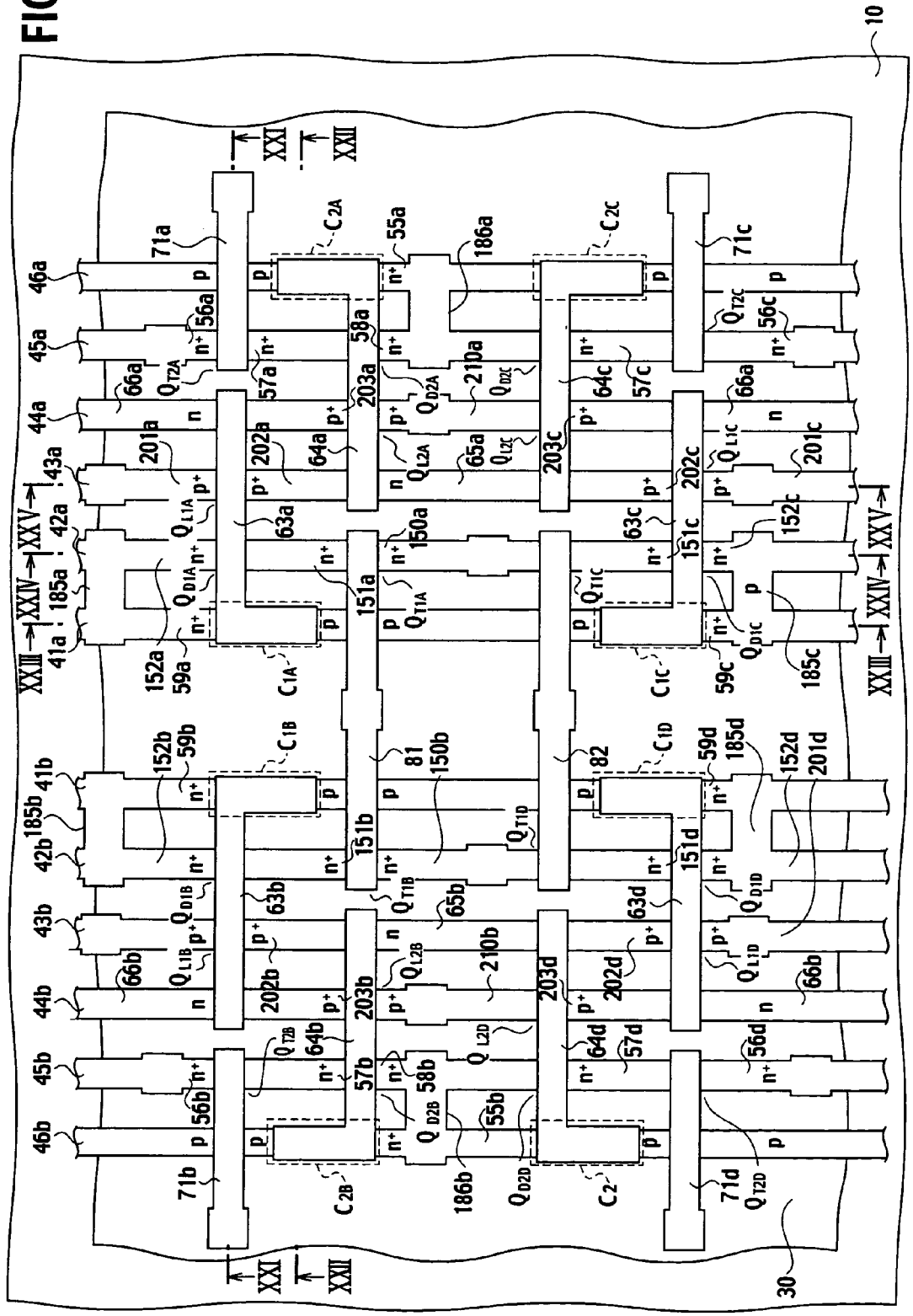
FIG. 20 is a fifth plane view of the cell array depicting the manufacturing process in accordance with the embodiment of the present invention.
Figure 21:
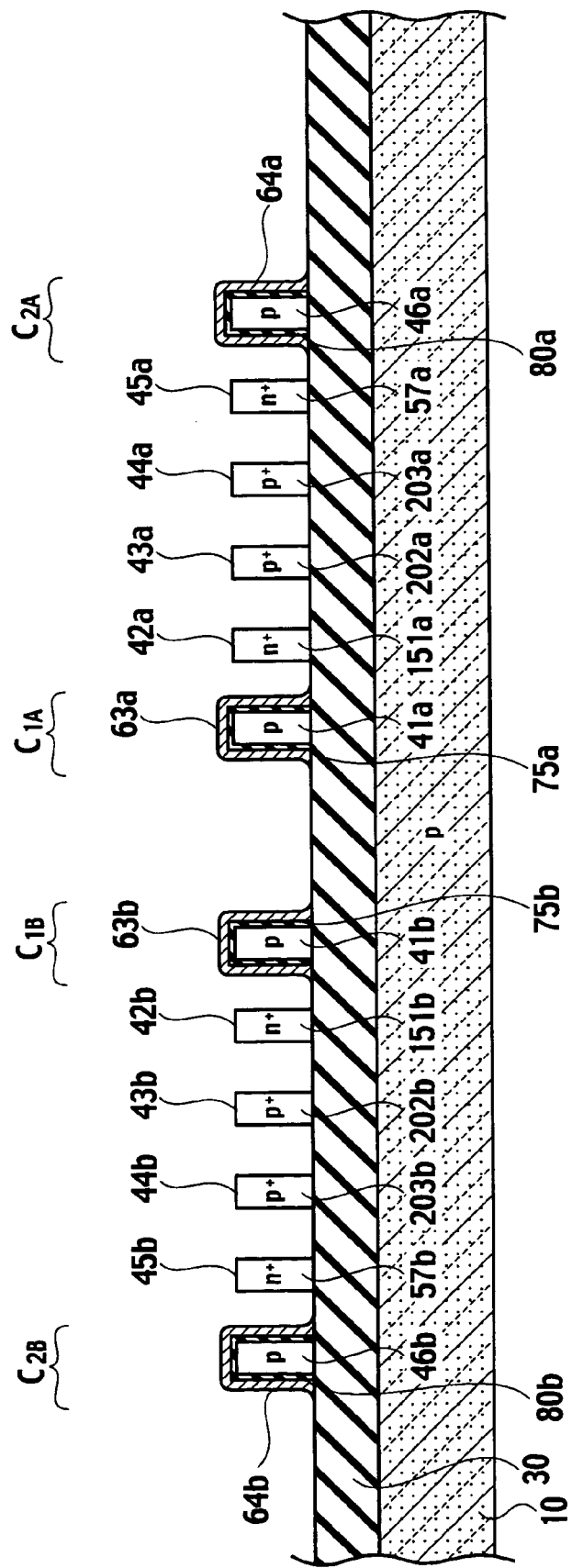
FIG. 21 is a sixth sectional view of the cell array depicting the manufacturing process in accordance with the embodiment of the present invention.
Figure 22:
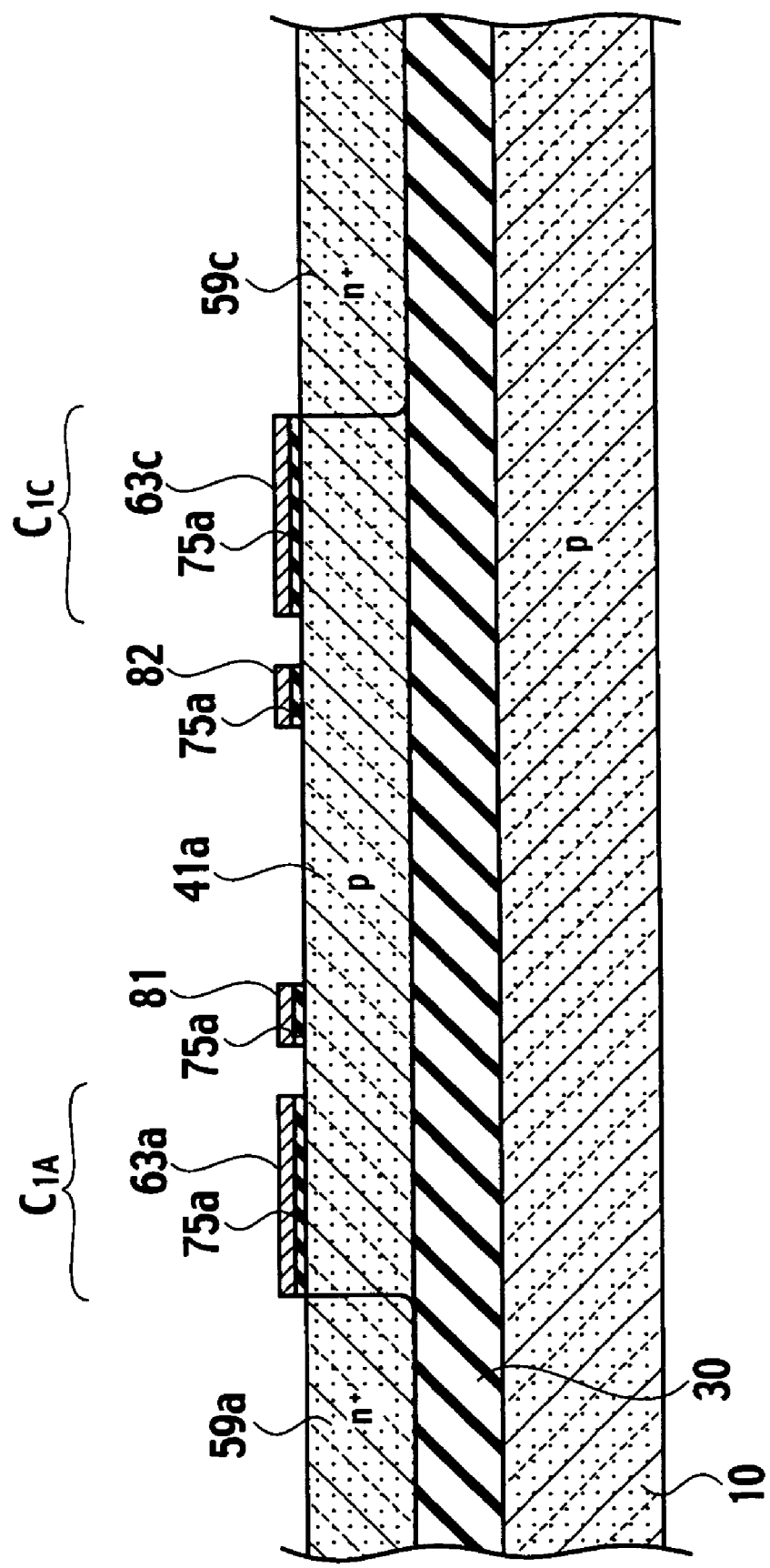
FIG. 22 is a seventh sectional view of the cell array depicting the manufacturing process in accordance with the embodiment of the present invention.
Figure 23:
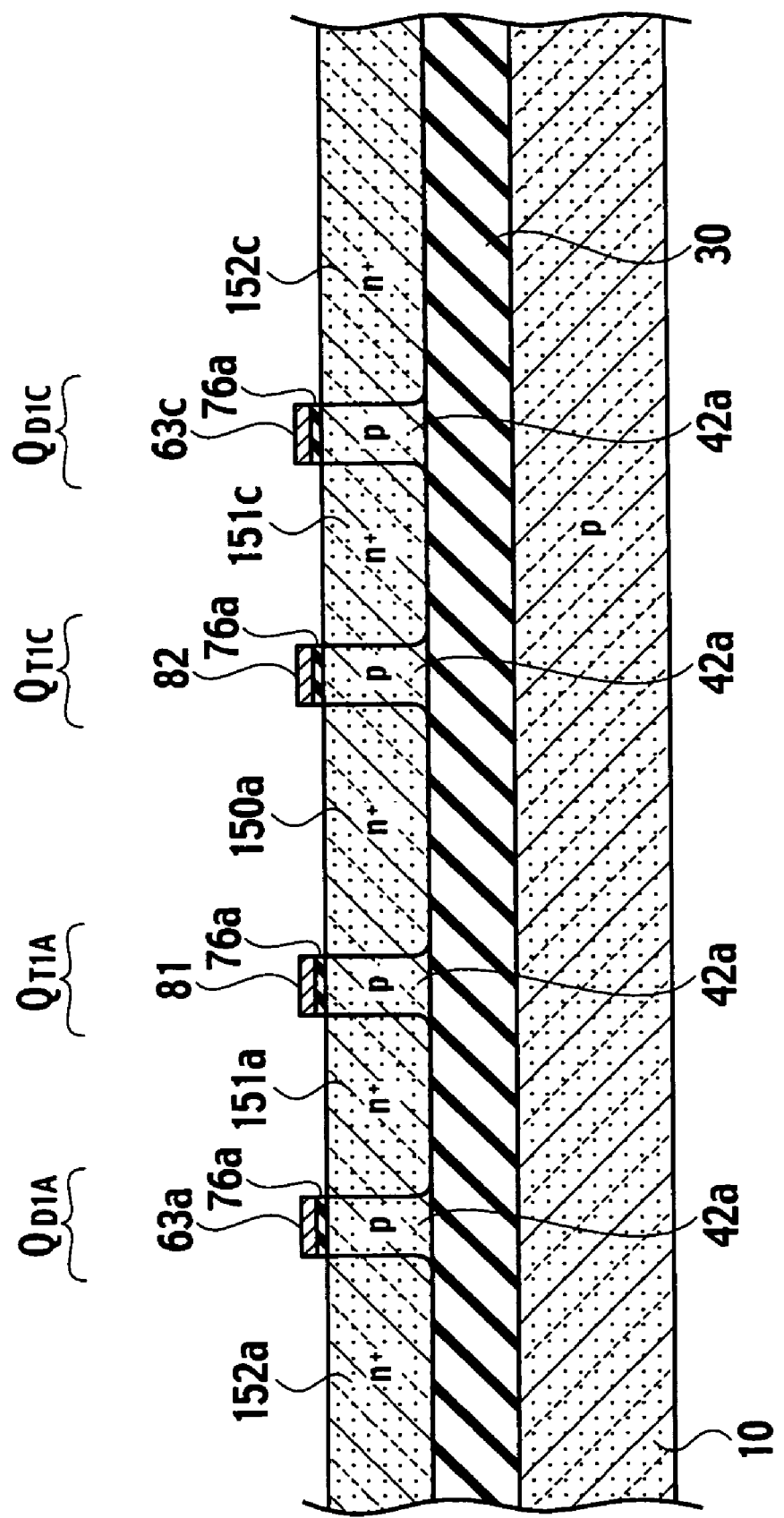
FIG. 23 is an eighth sectional view of the cell array depicting the manufacturing process in accordance with the embodiment of the present invention.
Figure 24:
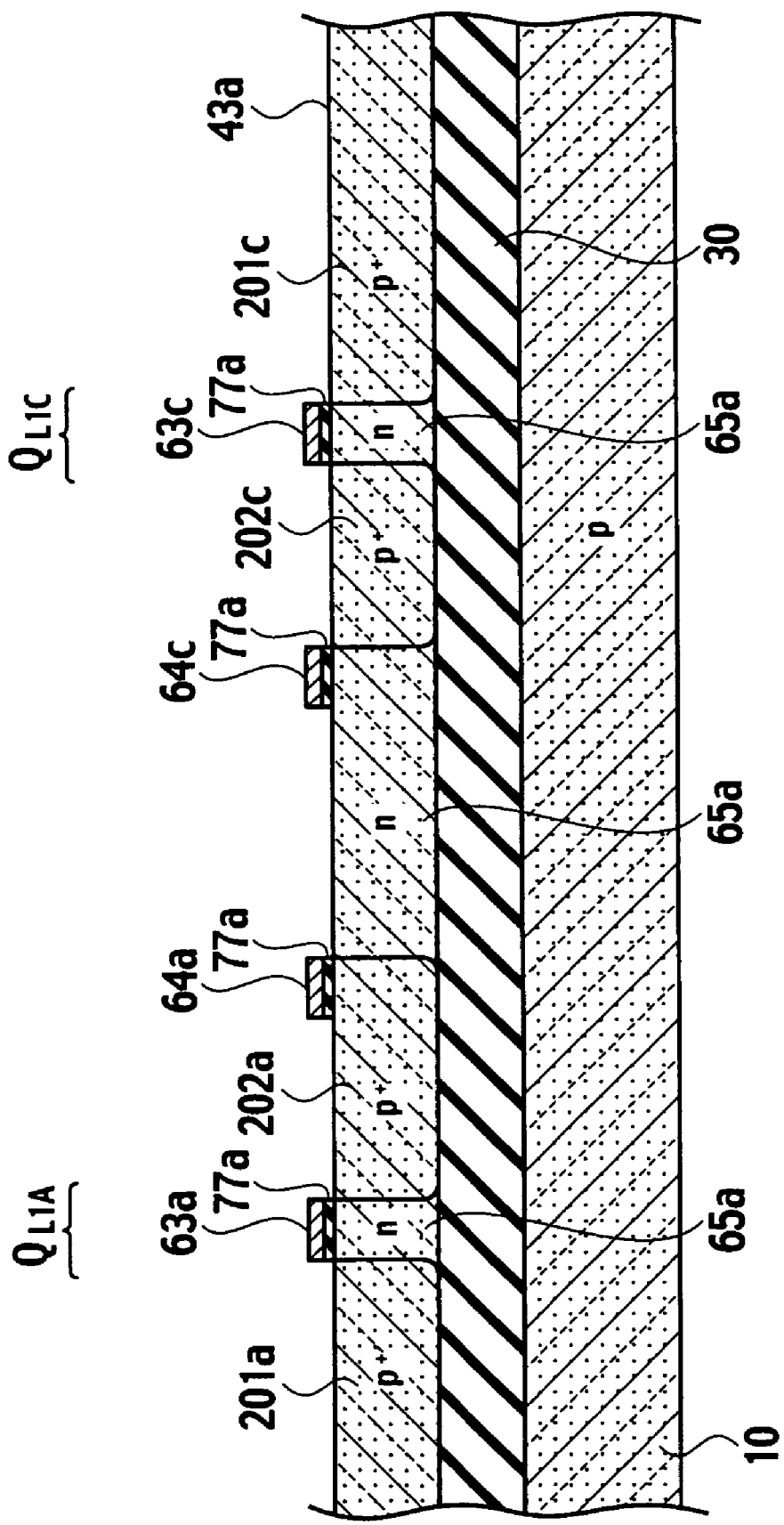
FIG. 24 is a ninth sectional view of the cell array depicting the manufacturing process in accordance with the embodiment of the present invention.

In FIG. 20, FIG. 21 which is a sectional view taken on line XXII—XXII in FIG. 20, FIG. 22 which is a sectional view taken on line XXIII—XXIII in FIG. 20, FIG. 23 which is a sectional view taken on line XXIV—XXIV in FIG. 20, and FIG. 24 which is a sectional view taken on line XXV—XXV in FIG. 20, the annealing process is employed to activate the doped first and second dopants and diffuse the doped first and second dopants in the first to sixth ridges 41a–46a, 41b–46b. Consequently, the $n^+$ semiconductor region 55a, 55b, 59a–59d is formed in the first riges 41a, 41b and the second ridges 46a, 46b. Also, the $n^+$ source region 56a–56d, 58a, 58b, 150a, 150b, 152a–152d, the $n^+$ drain region 57a–57d, 151a–151d, the $p^+$ source region 201a–201d, 210a, 210b, and the $p^+$ drain region 202a–202d, 203a–203d are formed in the second to fifth ridges 42a–45a, 42b–45b and self aligned by the first gate lines 63a–63d, the second gate lines 64a–64d, the gate electrodes 71a–71d, 81, 82. Consequently, the first transfer transistor $Q_{T1A}$–$Q_{T1D}$, the second transfer transistor $Q_{T2A}$–$Q_{T2D}$, the first driver transistor $Q_{D1A}$–$Q_{D1C}$, the second driver transistor $Q_{D2A}$–$Q_{D2D}$, the first load transistor $Q_{L1A}$–$Q_{L1D}$, the second load transistor $Q_{L2A}$–$Q_{L2D}$ are provided. Here, the sectional view taken on line XXI—XXI in FIG. 20 is same as FIG. 18.

Figure 25:
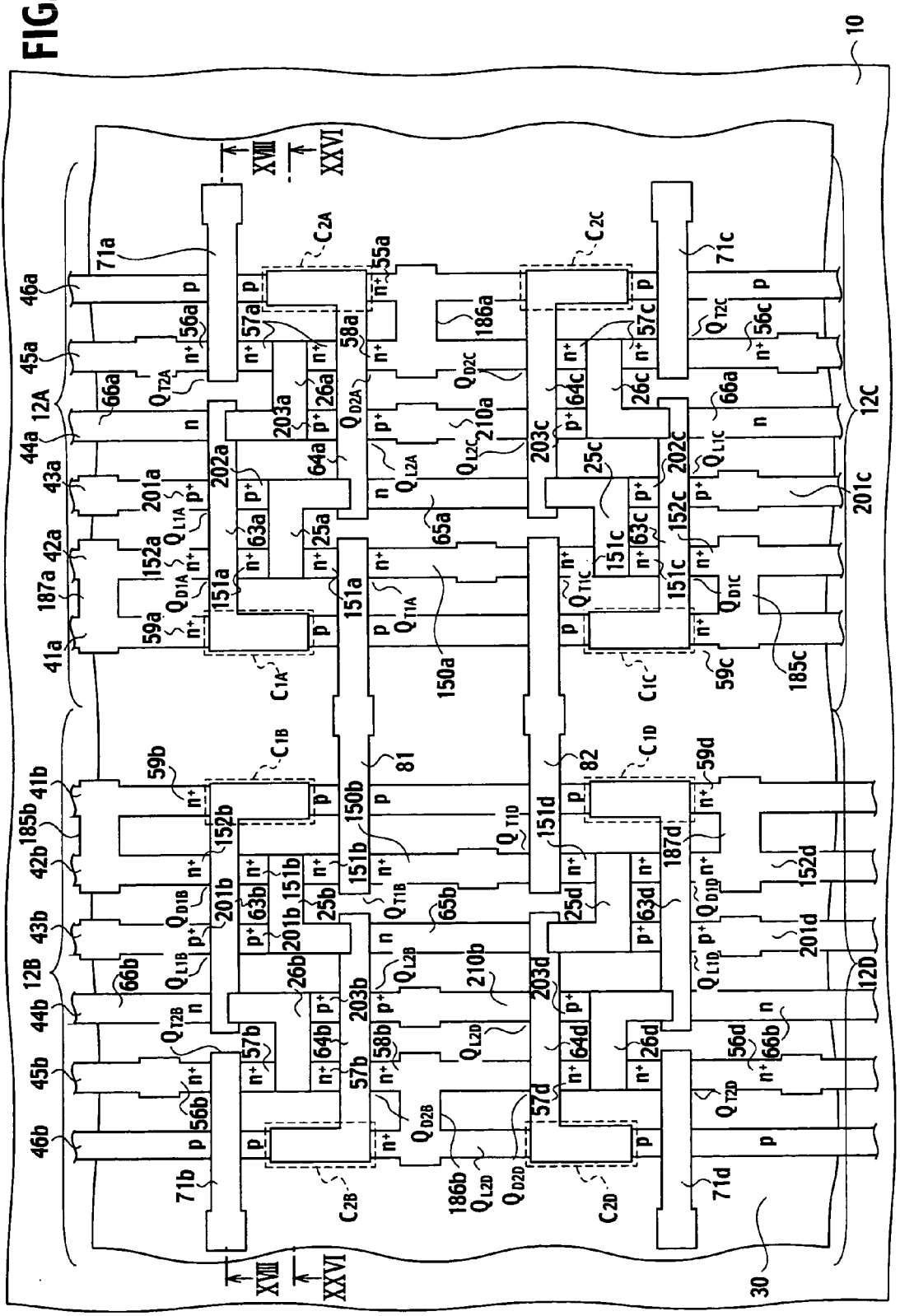
FIG. 25 is a sixth plane view of the cell array depicting the manufacturing process in accordance with the embodiment of the present invention.
Figure 26:
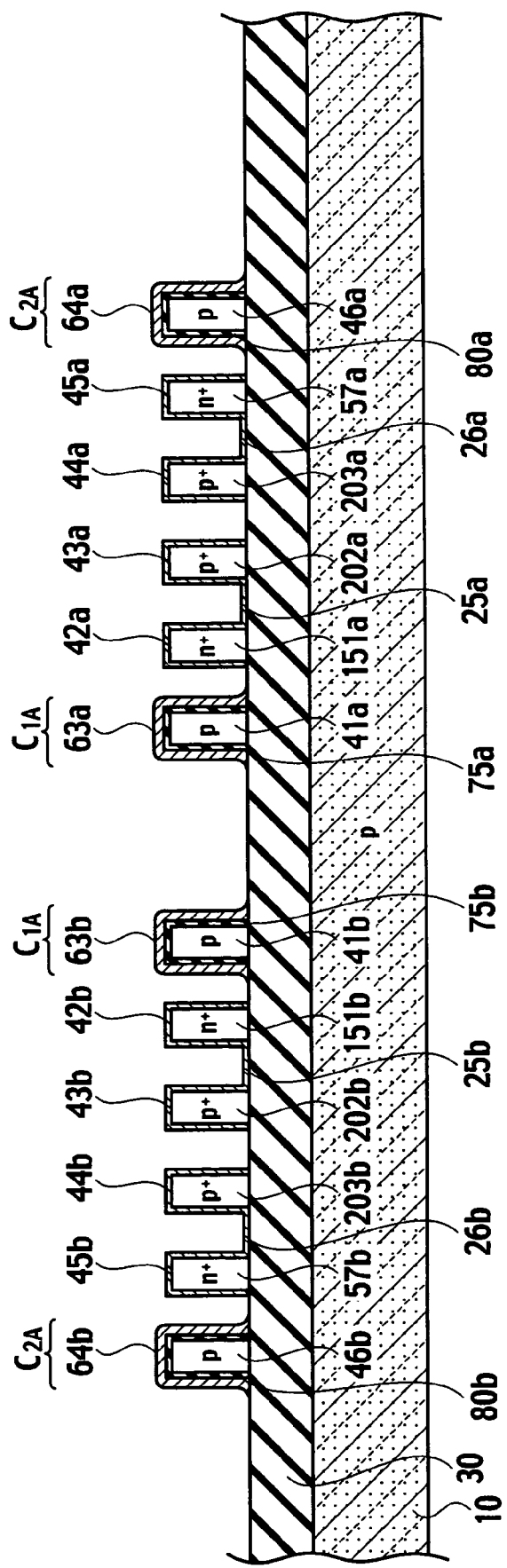
FIG. 26 is a tenth sectional view of the cell array depicting the manufacturing process in accordance with the embodiment of the present invention.

A second silicon oxide layer capping the first ridges 41a, 41b, the second ridges 42a, 42b, the third ridges 43a, 43b, the fifth ridges 45a, 45b, the fourth ridges 44a, 44b, and the terminal areas 185a–185d, 186a, 186b and grown by the annealing process is removed. Thereafter, a fourth mask resist is formed. A second polycrystalline silicon layer is selectively deposited on the buried insulator 30 by using the fourth mask resist. After the fourth mask resist is removed by the ash process, as shown in FIG. 25 and FIG. 26 which is a sectional view taken on line XXVI—XXVI in FIG. 25, the drain line 25a–25d, 26a–26d are formed. Here, the sectional view taken on line XVIII—XVIII in FIG. 25 is same as FIG. 18.

The first interlevel insulator 101 is deposited on the buried insulator 30 by the CVD process. Then, chemical mechanical planarization (CMP) process is employed to produce the planar surface of the first interlevel insulator 101. Thereafter, via holes are delineated in the first interlevel insulator 101 by use of the optical lithography and the anisotropic etch process. The via holes are filled with the refractory metal such as Mo and W by the sputtering or vaporization process. The excess refractory metal remaining on the first interlevel insulator 101 is removed by the CMP process. Consequently, the contact studs 169a–169d, 172a, 172b, 173a, 173b, 261a–261d, 283a–283d, 301a–301d, 302a, 302b, 361, 362 are formed in the first interlevel insulator 101. Thereafter, the electric conductor such as Al, Al—Si, and Al—Cu—Si is deposited on the first interlevel insulator 101 by the sputtering or vaporization process. The deposited electric conductor is selectively removed by use of the optical lithography and the anisotropic etch process to form the bit lines 122, 124, and 126, as shown in FIG. 27, FIG. 28 which is a sectional view taken on line XXVIII—XXVIII in FIG. 27, FIG. 29 which is a sectional view taken on line XXIX—XXIX in FIG. 27, FIG. 30 which is a sectional view taken on line XXX—XXX in FIG. 27, FIG. 31 which is a sectional view taken on line XXXI—XXXI in FIG. 27, and FIG. 32 which is a sectional view taken on line XXXII—XXXII in FIG. 27.

The second interlevel insulator 102 overlying the bit lines 122, 124, 126 is deposited on the first interlevel insulator 101 by the CVD process and the CMP process is employed to produce the planar surface of the second interlevel insulator 102. Then, via holes are delineated in the second interlevel insulator 102 by use of the optical lithography and the anisotropic etch process. The via holes are filled with the refractory metal by the sputtering or vaporization process. The excess refractory metal remaining on the second interlevel insulator 102 is removed by the CMP process. Consequently, the contact studs 170a–170d, 283a–283d, 311a–311d, 321, 322 are formed in the second interlevel insulator 102. Thereafter, the electric conductor is deposited on the second interlevel insulator 102 by the sputtering or vaporization process. The deposited electric conductor is selectively removed by use of the optical lithography and the anisotropic etch process to form the word lines 142, 144, and 146. Thereafter, the third interlevel insulator 103 overlying the word lines 142, 144, and 146 is deposited on the second interlevel insulator 102 by the CVD process and the CMP process is employed to produce the planar surface of the third interlevel insulator 103 and consequently the semiconductor memory according to the embodiment and shown in FIG. 5 is obtained.

Figure 27:
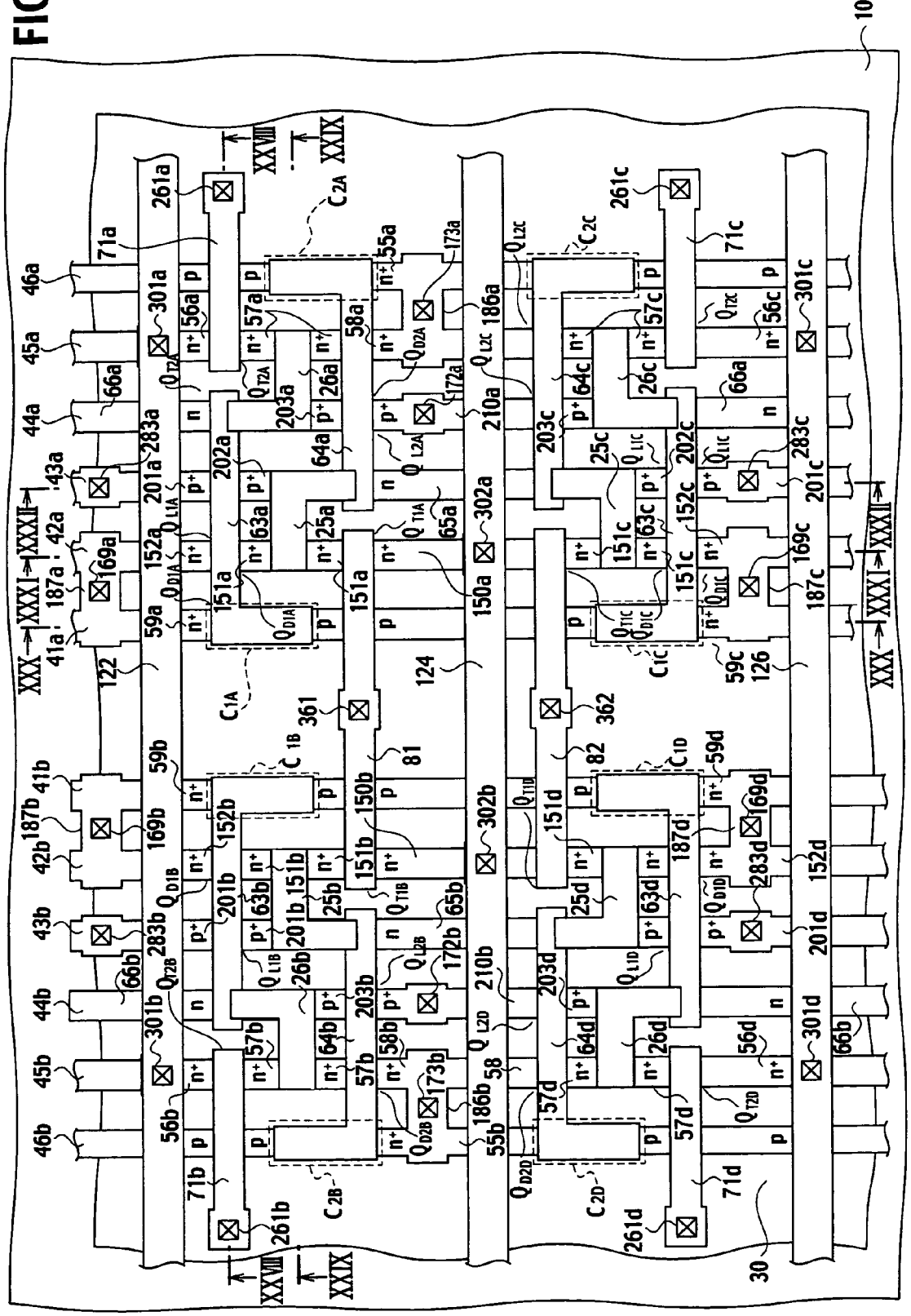
FIG. 27 is a seventh plane view of the cell array depicting the manufacturing process in accordance with the embodiment of the present invention.
Figure 28:
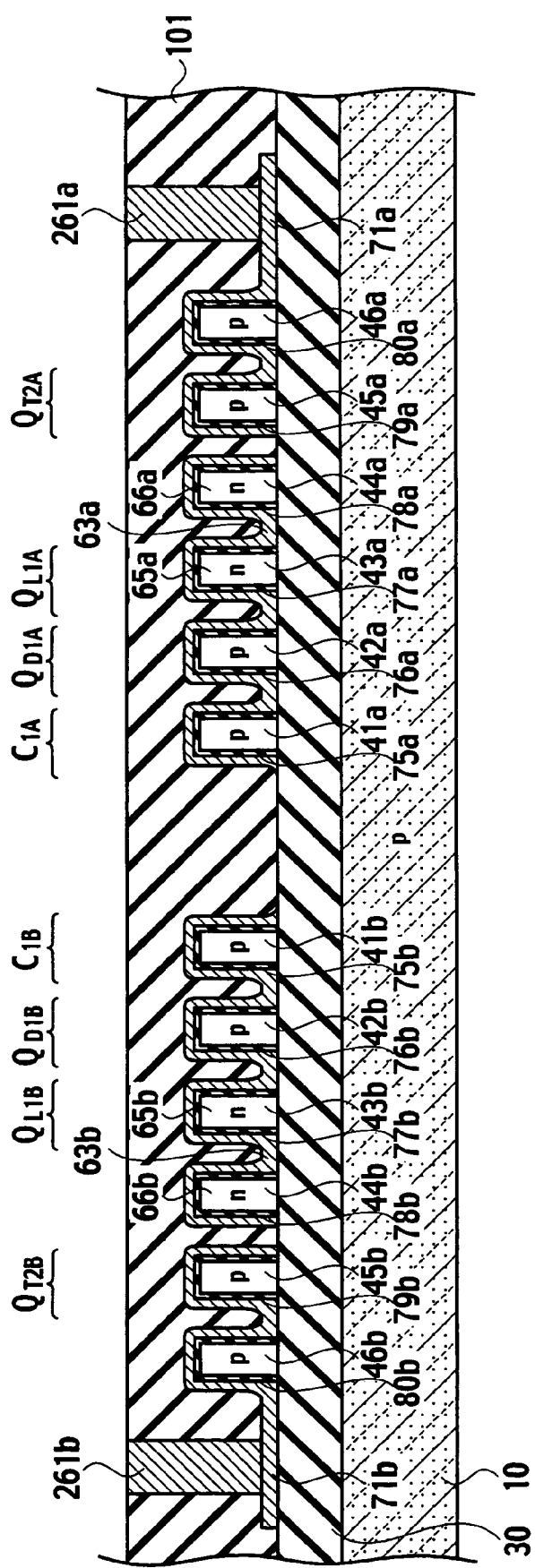
FIG. 28 is an eleventh sectional view of the cell array depicting the manufacturing process in accordance with the embodiment of the present invention.
Figure 29:
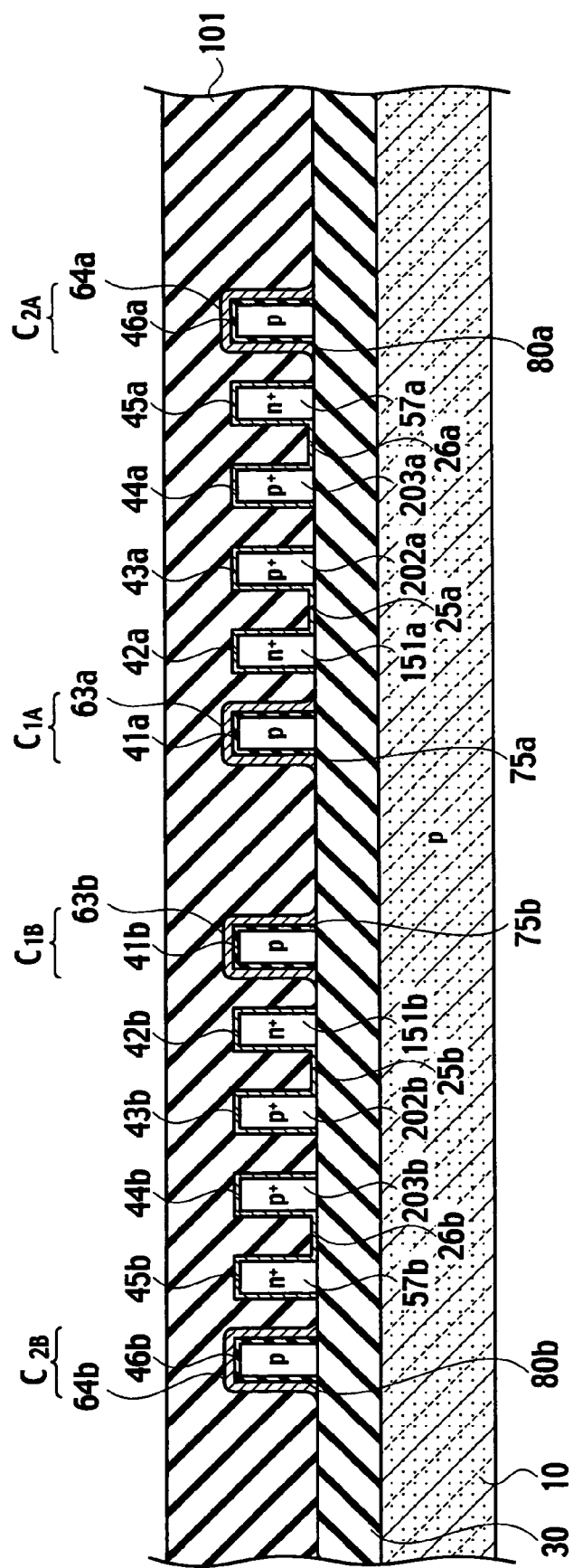
FIG. 29 is a twelfth sectional view of the cell array depicting the manufacturing process in accordance with the embodiment of the present invention.
Figure 30:
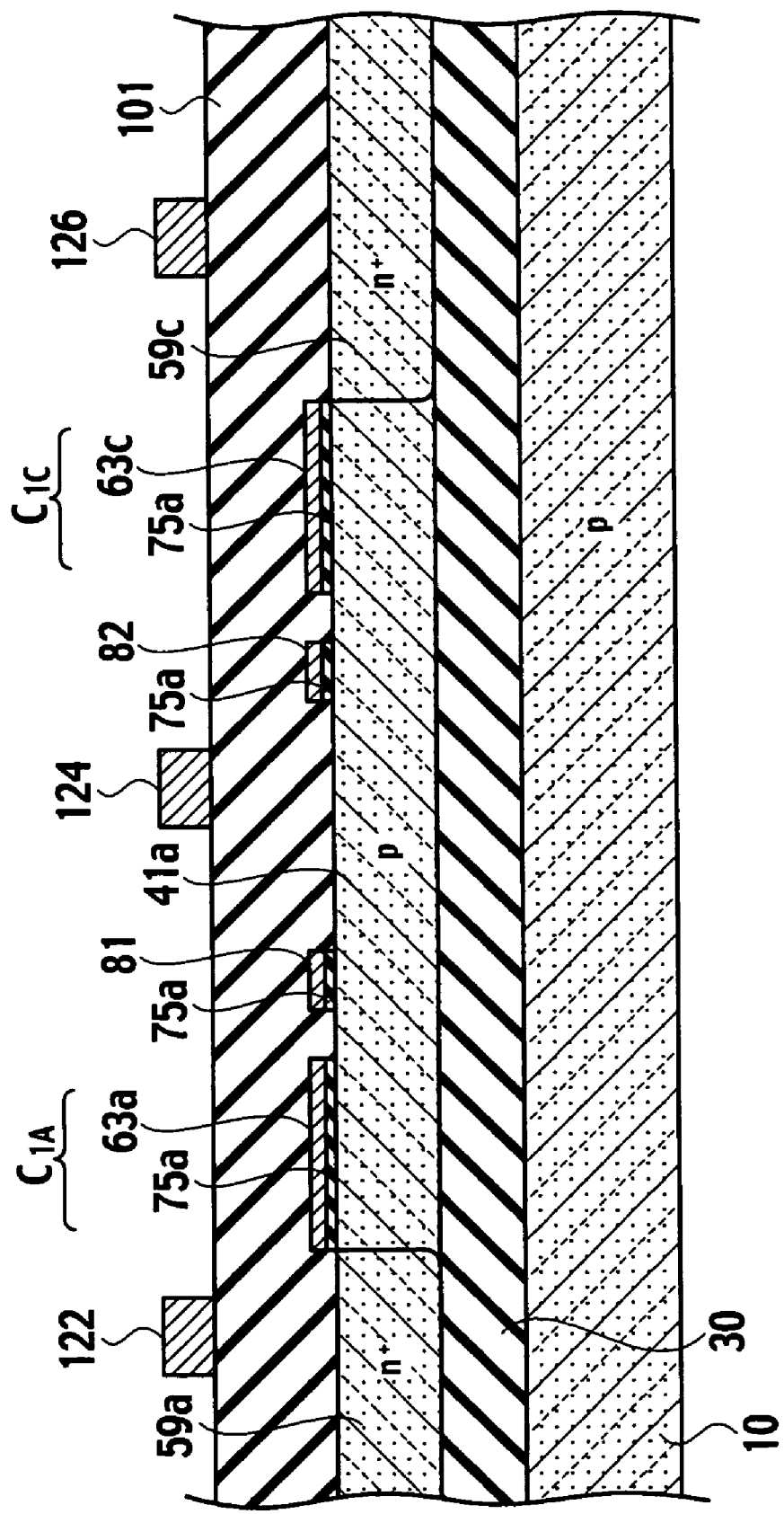
FIG. 30 is a thirteenth sectional view of the cell array depicting the manufacturing process in accordance with the embodiment of the present invention.
Figure 31:
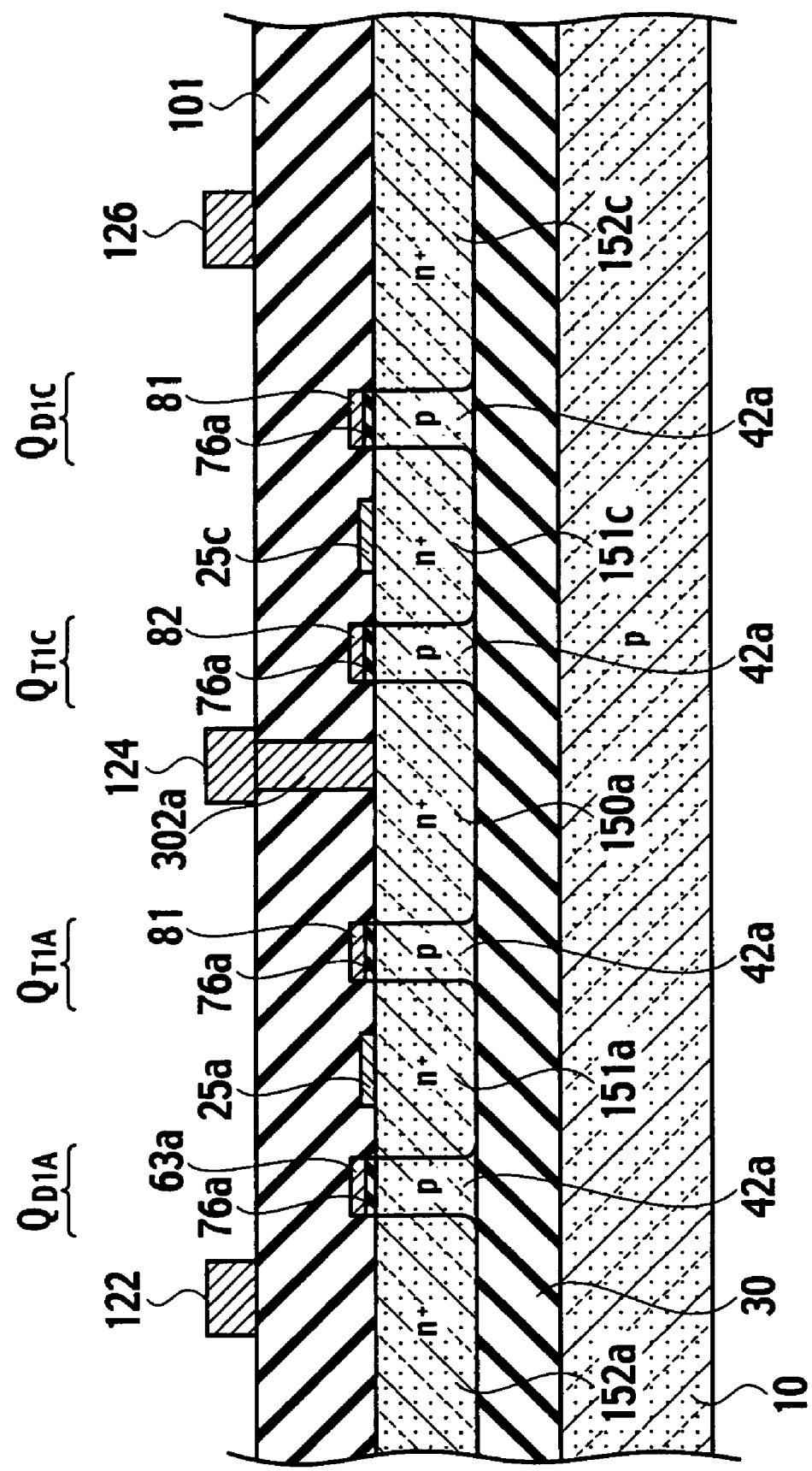
FIG. 31 is a fourteenth sectional view of the cell array depicting the manufacturing process in accordance with the embodiment of the present invention.
Figure 32:
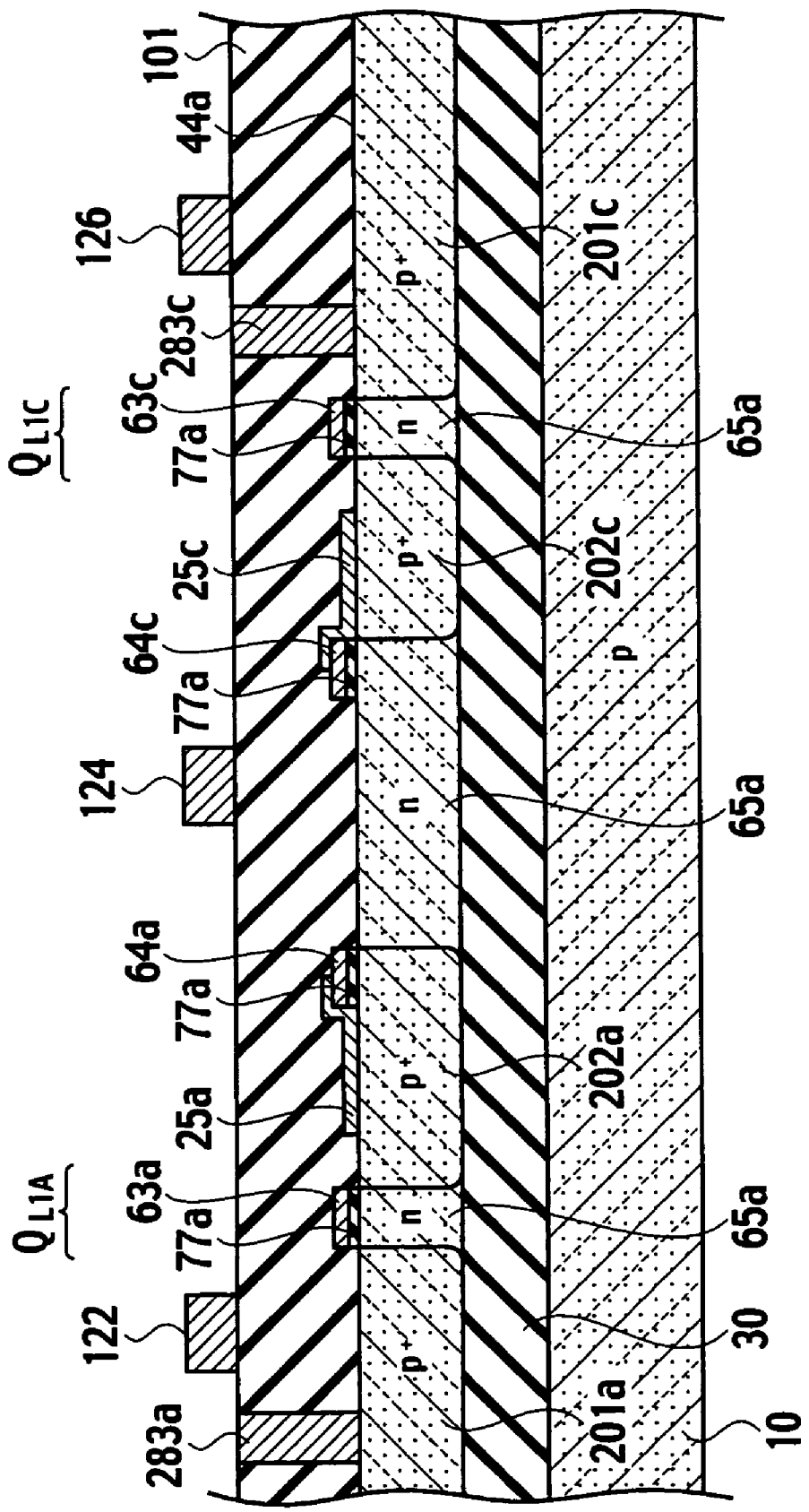
FIG. 32 is a fifteenth sectional view of the cell array depicting the manufacturing process in accordance with the embodiment of the present invention.

In above described method, the metal wiring such as bit lines 122, 124, and 126 shown in FIG. 27 are formed by the sputtering or vaporization process and the anisotropic etch process. However, the damascene process is also alternative. Specifically, delineating trenches corresponding to the pattern of the metal wiring in the interlevel insulator 101 by the lithography process, depositing copper (Cu) layer by the electroplating, and polishing the deposited Cu layer are also alternative.

The method according to the embodiment makes it possible to form the first capacitor $C_{1A}$–$C_{1D}$ and the second capacitor $C_{2A}$–$C_{2D}$ at the same time when the first and second gate lines 63a–63d and 64a–64d are formed. Also, masks for specifically manufacturing the first capacitor $C_{1A}$–$C_{1D}$ and the second capacitor $C_{2A}$–$C_{2D}$ are not required. Therefore, the method according to the embodiment makes it possible to manufacture the semiconductor memory containing capacitors without increasing complexity in the manufacturing process and additional masks required in the lithography process.

Other Embodiments

Although the invention has been described above by reference to the embodiment of the present invention, the present invention is not limited to the embodiment described above. Modifications and variations of the embodiment described above will occur to those skilled in the art, in the light of the above teachings.

Figure 33:
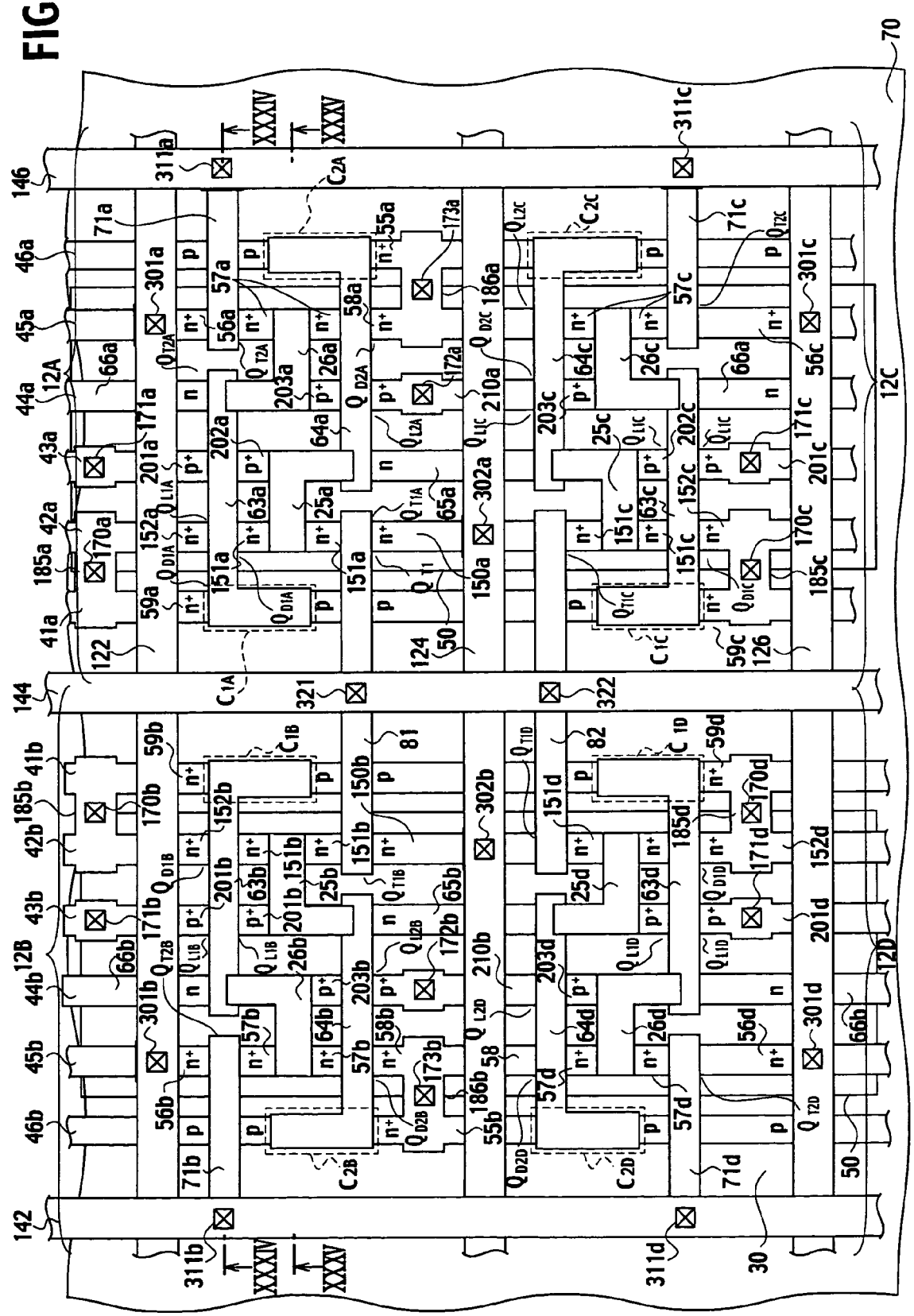
FIG. 33 is a plane view of the cell array in accordance with other embodiment of the present invention.

For example, the unit cells 12A–12D shown in FIGS. 5 to 10 are provided on the buried insulator 30. However, as shown in FIG. 33, FIG. 34 which is a sectional view taken on line XXXIV—XXXIV in FIG. 33, and FIG. 35 which is a sectional view taken on line XXXV—XXXV in FIG. 33, providing the unit cells 12A–12D on a semiconductor substrate 50 including a shallow trench isolation 70 is an alternative. The shallow trench isolation 70 is composed of $SiO_2$, for example. Here, the first ridges 41a, 41b and the sixth ridges 46a, 46b are disposed on the shallow trench isolation 70. The second ridges 42a, 42b, the third ridges 43a, 43b, the fourth ridges 44a, 44b, and the fifth ridges 45a, 45b are disposed on the semiconductor substrate 50.

Arrangement of other elements in the semiconductor memory is similar to the arrangement of the semiconductor memory shown in FIGS. 5 to 10.

A method for manufacturing the semiconductor memory shown in FIGS. 33 to 35 is as follows. The shallow trench isolation 70 is formed in the semiconductor substrate 50. Then, a silicon layer is deposited on the semiconductor substrate 50 and the deposited silicon layer is crystallized by the annealing process. Thereafter, the first ridges 41a, 41b, the sixth ridges 46a, 46b, the second ridges 42a, 42b, the third ridges 43a, 43b, the fifth ridges 45a, 45b, and the fourth ridges 44a, 44b are formed by the method as described with FIGS. 11 and 12. Following processes are similar to FIGS. 13 to 32. The semiconductor memory shown in FIGS. 33 to 35 prevents delayed soft error through the semiconductor substrate 50 since the first ridges 41a, 41b and the sixth ridges 46a, 46b are disposed on the shallow trench isolation 70.

Further, in the semiconductor memories shown in FIGS. 5 to 10 and FIGS. 33 to 35, the second ridges 42a, 42b, the third ridges 43a, 43b, the fifth ridges 45a, 45b, and the fourth ridges 44a, 44b are arranged between the first ridges 41a, 41b and the sixth ridges 46a, 46b. However, arranging the ridges provided with the capacitors between the ridges provided with the driver transistors or the load transistors is also alternative.

As described above, the present invention includes many variations of embodiments. Therefore, the scope of the invention is defined with reference to the following claims.

What is claimed is:

1. A master chip comprising:
   a plurality of unit cells arranged in rows and columns, each of the unit cells comprising:
      a plurality of parallel semiconductor ridges including first to sixth ridges;
      an insulating layer disposed on each of the first to sixth ridges;
      a first gate line extending in a direction orthogonal to the first to sixth ridges and disposed above the first to fourth ridges; and
      a second gate line extending in the direction orthogonal to the first to sixth ridges and disposed above the third to sixth ridges,
   wherein the first ridge, the insulating layer, and the first gate line implement a first capacitor, the second and third ridges and the first gate line implement a first driver transistor and a first load transistor, the fourth and fifth ridges and the second gate lines implement a second load transistor and a second driver transistor, and the sixth ridge, the insulating layer, and the second gate line implement a second capacitor.

2. A semiconductor memory comprising:
   a plurality of parallel semiconductor ridges including first to sixth ridges;
   an insulating layer disposed on each of the first to sixth ridges;
   a first gate line extending in a direction orthogonal to the first to sixth ridges and disposed above the first to fourth ridges; and
   a second gate line extending in the direction orthogonal to the first to sixth ridges and disposed above the third to sixth ridges,
   wherein the first ridge, the insulating layer, and the first gate line implement a first capacitor, the second and third ridges and the first gate line implement a first driver transistor and a first load transistor, the fourth and fifth ridges and the second gate lines implement a second load transistor and a second driver transistor, and the sixth ridge, the insulating layer, and the second gate line implement a second capacitor.

3. The semiconductor memory of claim 2, further comprising isolated doped regions provided in the second ridge, having opposite conductivity to the conductivity of the second ridge, the isolated doped regions implementing source and drain regions of the first driver transistor, respectively.

4. The semiconductor memory of claim 3, further comprising isolated doped regions provided in the third ridge, having opposite conductivity to the conductivity of the third ridge, the isolated doped regions implementing source and drain regions of the first load transistor, respectively.

5. The semiconductor memory of claim 4, further comprising a drain line electrically connecting the drain region of the first driver transistor, the drain region of the first load transistor, and the second gate line.

6. The semiconductor memory of claim 1, further comprising isolated doped regions provided in the fourth ridge, having opposite conductivity to the conductivity of the fourth ridge, the isolated doped regions implementing source and drain regions of the second load transistor, respectively.

7. The semiconductor memory of claim 6, further comprising isolated doped regions provided in the fifth ridge, having opposite conductivity to the conductivity of the fifth ridge, the isolated doped regions implementing source and drain regions of the second driver transistor, respectively.

8. The semiconductor memory of claim 7, further comprising a drain line electrically connecting the drain region of the second driver transistor, the drain region of the second load transistor, and the first gate line.

9. The semiconductor memory of claim 1 further comprising a gate electrode disposed above the second ridge, wherein the second ridge, the insulating layer, and the gate electrode implement a first transfer transistor.

10. The semiconductor memory of claim 1 further comprising a gate electrode disposed above the fifth ridge, wherein the fifth ridge, the insulating layer, and the gate electrode implement a second transfer transistor.

11. The semiconductor memory of claim 1, wherein the second to fifth ridges are arranged between the first and sixth ridges.

12. The semiconductor memory of claim 1, wherein the first to sixth ridges are disposed on a buried insulator.

13. The semiconductor memory of claim 1, wherein the second to fifth ridges are disposed on a semiconductor substrate and the first and sixth ridges are disposed on a shallow trench isolation.

* * * * *